United States Patent
Pavier et al.

(10) Patent No.: US 10,283,432 B2
(45) Date of Patent: May 7, 2019

(54) MOLDED PACKAGE WITH CHIP CARRIER COMPRISING BRAZED ELECTRICALLY CONDUCTIVE LAYERS

(71) Applicant: Infineon Technologies AG, Neubiberg (DE)

(72) Inventors: Mark Pavier, Felbrigde (GB); Wolfram Hable, Neumarkt (DE); Angela Kessler, Sinzing (DE); Michael Sielaff, Erwitte (DE); Anton Pugatschow, Soest (DE); Charles Rimbert-Riviere, Soest (DE); Marco Sobkowiak, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/111,606

(22) Filed: Aug. 24, 2018

(65) Prior Publication Data
US 2019/0006260 A1 Jan. 3, 2019

Related U.S. Application Data

(62) Division of application No. 15/649,459, filed on Jul. 13, 2017, now Pat. No. 10,074,590.

(30) Foreign Application Priority Data

Jul. 2, 2017 (EP) .................................. 17290085

(51) Int. Cl.
| | |
|---|---|
| *H01L 21/48* | (2006.01) |
| *H01L 23/373* | (2006.01) |
| *B60R 16/02* | (2006.01) |
| *H01L 21/56* | (2006.01) |
| *H01L 25/18* | (2006.01) |

(Continued)

(52) U.S. Cl.
CPC ......... *H01L 23/3735* (2013.01); *B60R 16/02* (2013.01); *H01L 21/4807* (2013.01); *H01L 21/4825* (2013.01); *H01L 21/565* (2013.01); *H01L 23/293* (2013.01); *H01L 23/3114* (2013.01); *H01L 23/49861* (2013.01); *H01L 23/50* (2013.01); *H01L 24/45* (2013.01); *H01L 24/48* (2013.01); *H01L 25/18* (2013.01); *H01L 2224/45014* (2013.01); *H01L 2224/48175* (2013.01); *H01L 2924/1203* (2013.01);
(Continued)

(58) Field of Classification Search
CPC ............. H01L 21/4803; H01L 21/4807; H01L 21/4825; H01L 21/4846; H01L 21/565
See application file for complete search history.

(56) References Cited

U.S. PATENT DOCUMENTS 8,455,987 B1 * 6/2013 Spann ..................... H01L 21/56
257/675
2006/0231943 A1 10/2006 Chiu

* cited by examiner

Primary Examiner — Hoai V Pham

(57) ABSTRACT

A method of manufacturing a package, wherein the method comprises a forming a chip carrier by covering a thermally conductive and electrically insulating core on both opposing main surfaces thereof at least partially by a respective electrically conductive layer by brazing the respective electrically conductive layer on a respective one of the main surfaces; a mounting at least one electronic chip on the chip carrier; an electrically coupling an electrically conductive contact structure with the at least one electronic chip; and an encapsulating part of the electrically conductive contact structure, and at least part of the chip carrier and of the at least one electronic chip by a mold-type encapsulant.

20 Claims, 14 Drawing Sheets

(51) Int. Cl.
*H01L 23/29* (2006.01)
*H01L 23/00* (2006.01)
*H01L 23/498* (2006.01)
*H01L 23/50* (2006.01)
*H01L 23/31* (2006.01)

(52) U.S. Cl.
CPC ............... *H01L 2924/13055* (2013.01); *H01L 2924/14252* (2013.01)

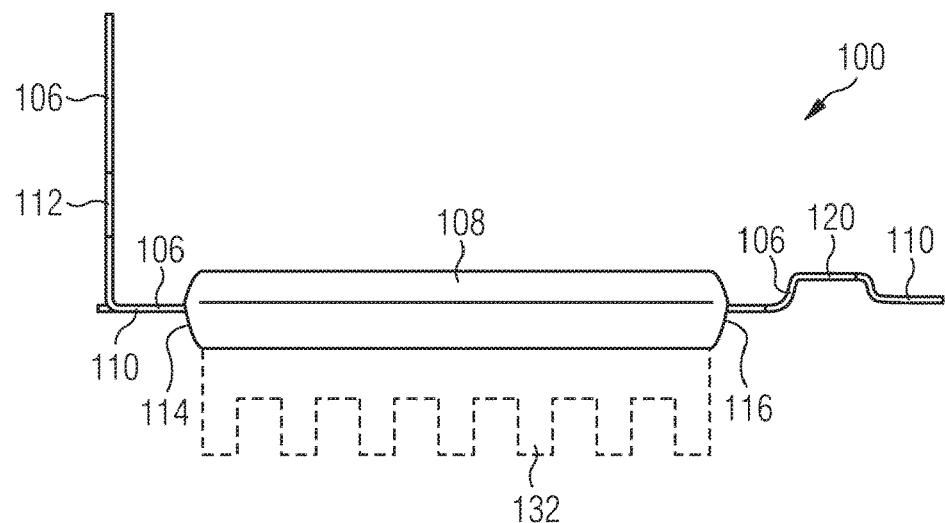
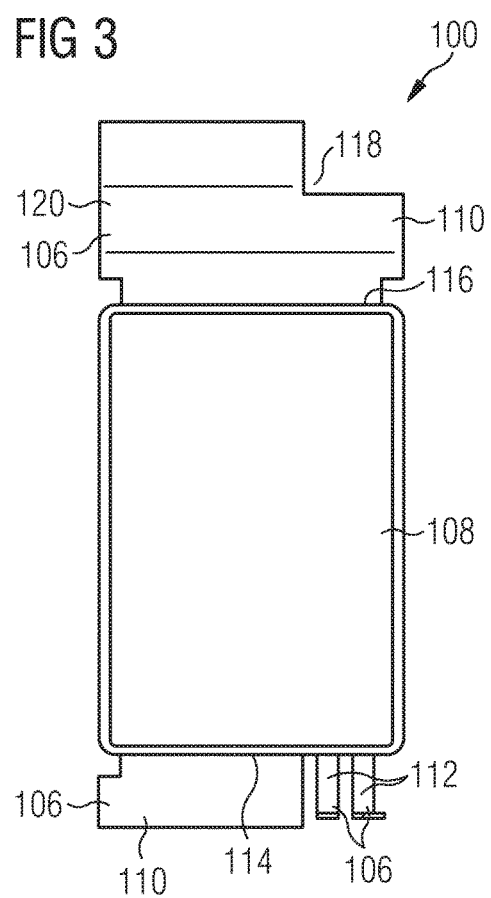

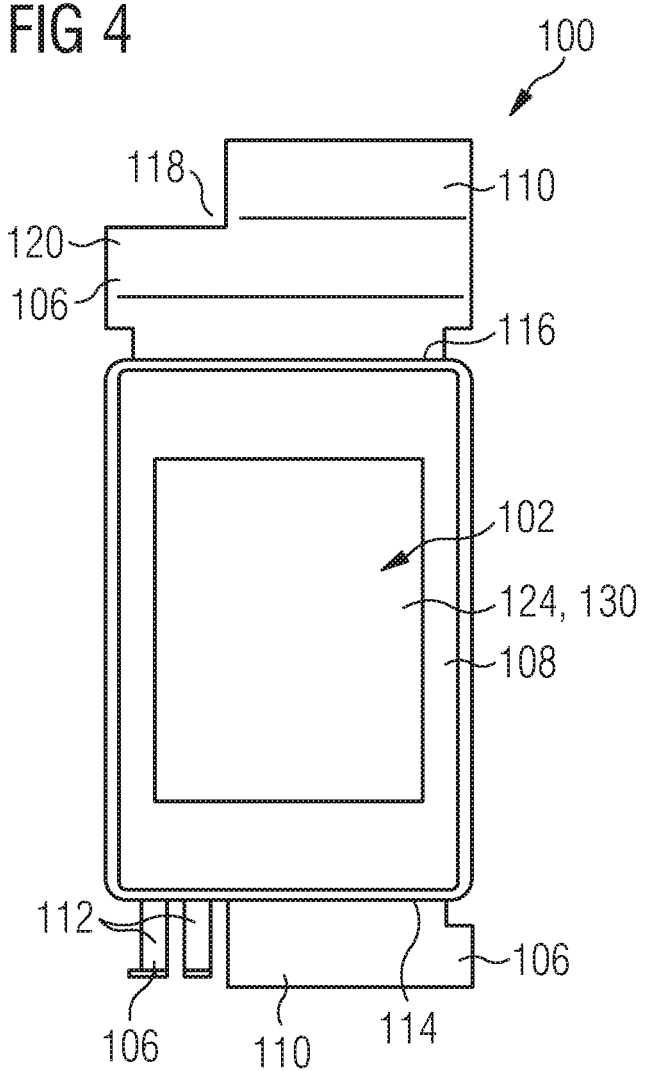

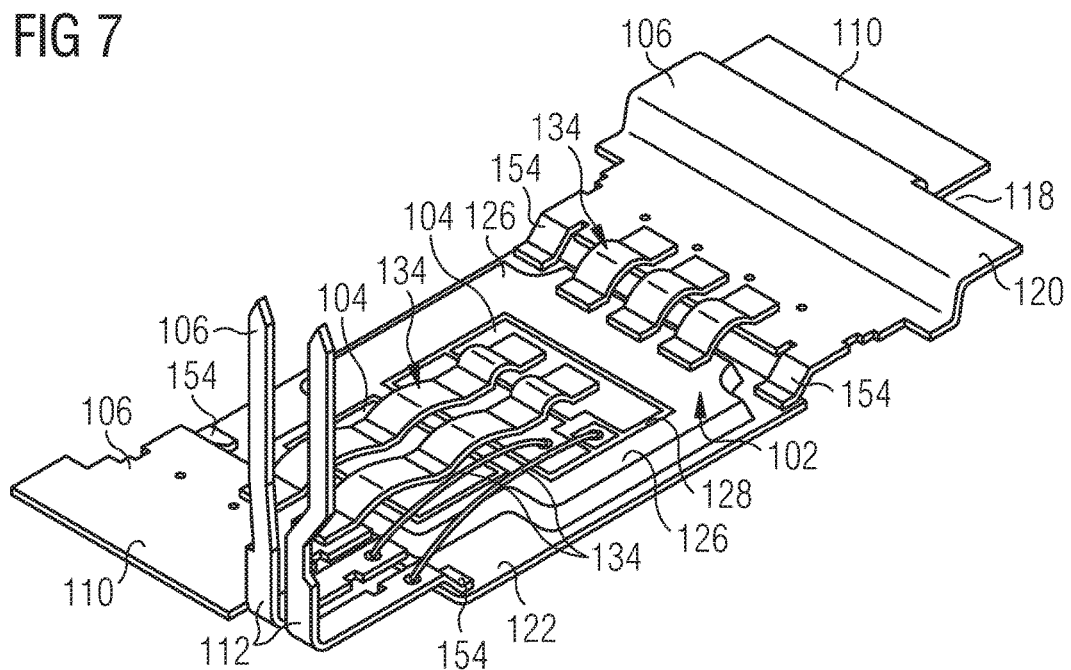
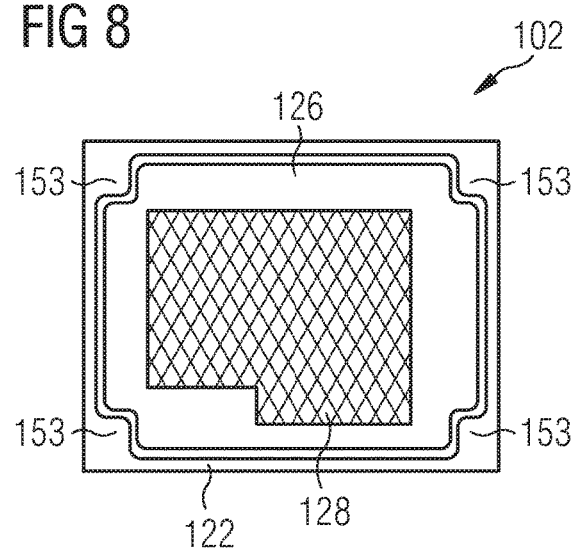

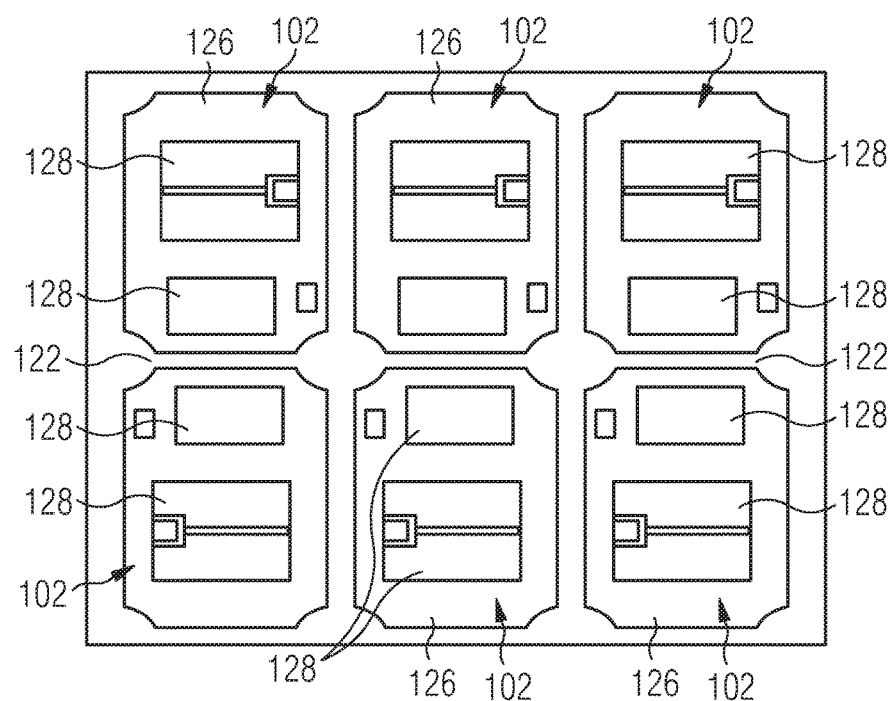

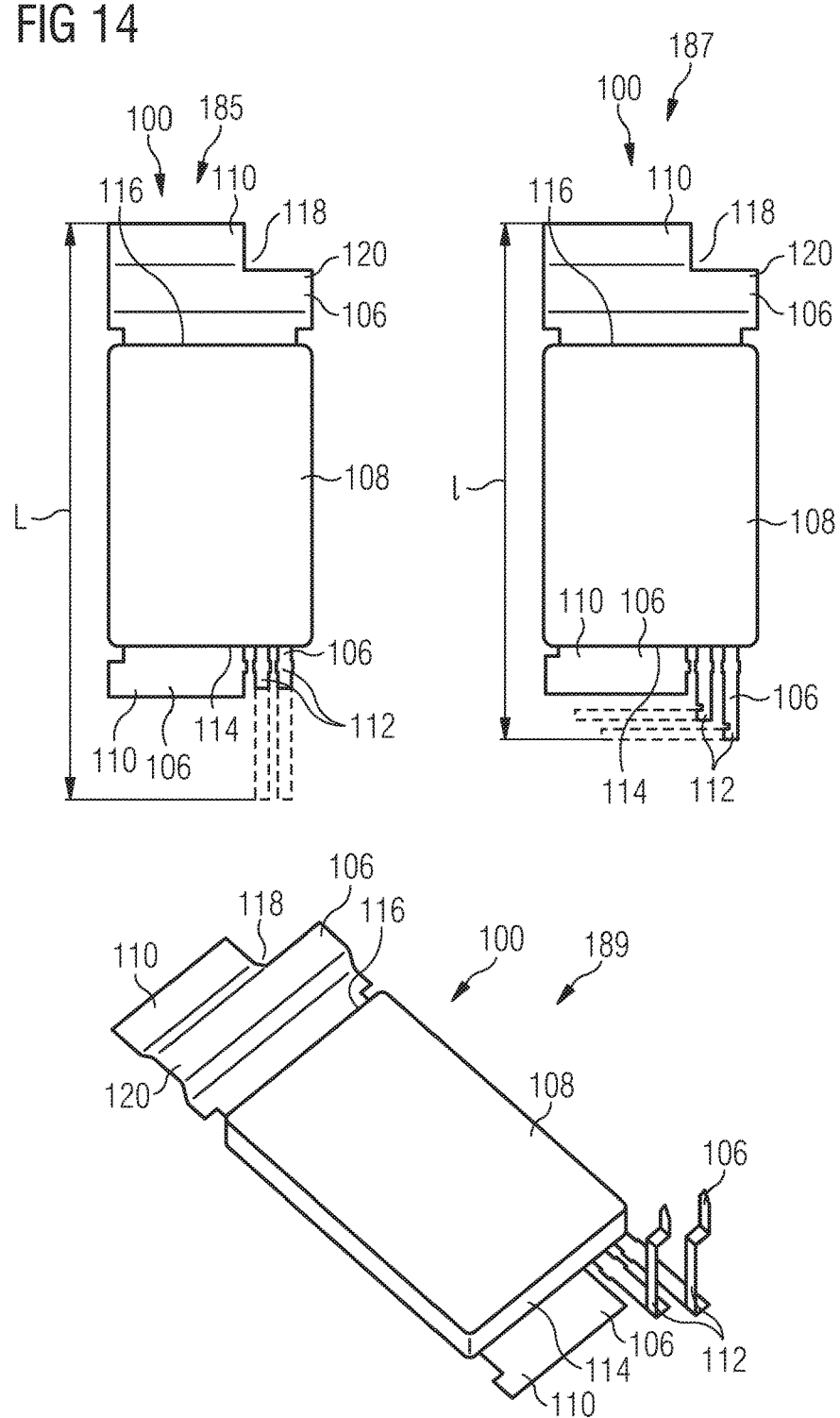

MOLDED PACKAGE WITH CHIP CARRIER COMPRISING BRAZED ELECTRICALLY CONDUCTIVE LAYERS

BACKGROUND OF THE INVENTION

Field of the Invention

The present invention relates to a method of manufacturing a package.

Description of the Related Art

Encapsulant materials, such as mold structures, for electronic components and in particular electronic chips have evolved to a level where the package no longer significantly impedes the performance of the components. Encapsulating electronic components during package manufacture may protect them against the environment.

Conventionally, Direct Copper Bonding (DCB) substrates have been used as chip carrier for mounting one or more electronic chips thereon, and for being subsequently encapsulated by a mold compound. A DCB substrate is composed of a ceramic core having two thin copper layers thereon. In DCB technology, the copper layers are connected with the ceramic core by an eutectic method, i.e. by simply putting the copper layers on the main surfaces of the ceramic core and heating slightly below the melting point of copper (for instance to a temperature of for instance about 1065° C.). As a result, the copper layers are directly connected to the ceramic core. Correspondingly formed packages show a proper performance in terms of electrical and mechanical reliability, as well as a proper thermal performance.

However, there is still potentially room to further improve electric and mechanical reliability as well as thermal performance of a package.

SUMMARY OF THE INVENTION

There may be a need for a mechanically and electrically reliable package which has a proper thermal performance.

According to an exemplary embodiment, a package is provided which comprises a chip carrier, at least one electronic chip mounted on the chip carrier, an electrically conductive contact structure electrically coupled with the at least one electronic chip, and a mold-type encapsulant encapsulating part of the electrically conductive contact structure, and at least part of the chip carrier and of the at least one electronic chip, wherein the chip carrier comprises a thermally conductive and electrically insulating core covered on both opposing main surfaces thereof at least partially by a respective brazed (i.e. formed by brazing) electrically conductive layer.

According to another exemplary embodiment, a package is provided which comprises a chip carrier which comprises a thermally conductive and electrically insulating core covered on both opposing main surfaces thereof at least partially by a respective brazed electrically conductive layer (in particular an Active Metal Brazed substrate), at least one electronic chip mounted (in particular sintered) on the chip carrier, and an electrically conductive contact structure (in particular of a leadframe type) comprising at least one downholder section (in particular at least three downholder sections) configured as touchdown region for pressing the chip carrier towards a mold tool during molding for preventing mold flash.

According to another exemplary embodiment, an electronic device is provided which comprises two or more (in particular interconnected) packages having the above-mentioned features (wherein in particular one of the power terminals of one of the packages may be electrically coupled with one of the power terminals of the other one of the packages).

According to yet another exemplary embodiment, a method of manufacturing a package is provided, wherein the method comprises forming a chip carrier by covering a thermally conductive and electrically insulating core on both opposing main surfaces thereof at least partially with a respective electrically conductive layer by brazing the respective electrically conductive layer on a respective one of the main surfaces, mounting at least one electronic chip on the chip carrier, electrically coupling an electrically conductive contact structure with the at least one electronic chip, and encapsulating part of the electrically conductive contact structure, and at least part of the chip carrier and of the at least one electronic chip by a mold-type encapsulant.

According to still another exemplary embodiment, a package having the above-mentioned features or an electronic device having the above-mentioned features is used for an automotive application, in particular in a power train of a vehicle, more particularly as an inverter in a power train of a vehicle.

According to an exemplary embodiment, a package is provided being encapsulated by molding and having a chip carrier with electrically conductive layers and a thermally conductive and electrically insulating core between, the mentioned core and layers being connected by brazing. When establishing a connection between the electrically conductive layers and the thermally conductive and electrically insulating core by brazing (rather than by an eutectic method or by soldering), the electric reliability of the package can be significantly improved while simultaneously obtaining a package with pronounced heat spreading capability and high mechanical integrity. The improved electric reliability of the package results from the fact that, by brazing the electrically conductive layers on the thermally conductive and electrically insulating core, the tendency of formation of voids or empty spaces at an interface between the electrically conductive layers and the thermally conductive and electrically insulating core can be significantly reduced. Conventionally, such voids limit the electric reliability in view of the highly disturbing phenomenon of partial discharge. The phenomenon of partial discharge can be denoted as a localized dielectric breakdown of a small portion of electric insulation under high voltage stress, which does not bridge the space between the two conductors. By suppressing partial discharge in the package due to brazing the electrically conductive layers on the thermally conductive and electrically insulating core, a package according to an exemplary embodiment is particularly appropriate for high voltage applications (in particular traction). At the same time, it has turned out that a chip carrier with brazed constituents can be encapsulated by molding without the risk of delamination, thereby obtaining also a high degree of mechanical integrity. Moreover, the mentioned chip carrier with its brazed and hence substantially air gap free constituents is capable of removing a high amount of heat generated by the one or more electronic chips during operation of the package. The mentioned advantages are particularly pronounced when implementing the package as a power package for an automotive application, for instance in an electrically driven vehicle.

DESCRIPTION OF FURTHER EXEMPLARY EMBODIMENTS

In the context of the present application, the term "package" may particularly denote at least one partially or fully encapsulated electronic chip with at least one external electric contact.

In the context of the present application, the term "electronic chip" may particularly denote a chip (more particularly a semiconductor chip) providing an electronic function. The electronic chip may be an active electronic component. In one embodiment, the electronic chip is configured as a controller chip, a processor chip, a memory chip, a sensor chip or a micro-electromechanical system (MEMS). In an alternative embodiment, it is also possible that the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc. The electronic chip may be a naked die or may be already packaged or encapsulated.

In the context of the present application, the term "encapsulant" may particularly denote a substantially electrically insulating and preferably thermally conductive material surrounding an electronic chip and part of a chip carrier to provide mechanical protection, electrical insulation, and optionally a contribution to heat removal during operation. Such an encapsulant can be, for example, a mold compound.

In the context of the present application, the term "mold-type encapsulant" may particularly denote a material (which may be a plastic material, in particular a resin-based material, more particularly an epoxy resin-based material) which may be applied in a liquid or viscous state around at least part of an electronic chip, chip carrier and electrically conductive contact structure and may then be cured or hardened so as to form a solid electrically insulating encapsulation. In order to prevent flow of liquid or viscous mold material into undesired regions, the mold material may be supplied between mold tools which are only removed after curing or hardening the mold material.

In the context of the present application, the term "brazing" may particularly denote a material joining process in which two or more items (at least one of which being a metallic material) are joined together by melting and flowing a filler material into the joint, the filler material having a lower melting point than the adjoining materials. Brazing differs from welding in that it does not involve melting the work pieces, and differs from soldering in using higher temperatures (in particular at least 600° C.), while also requiring much more closely fitted parts than when soldering. During brazing, the filler material advantageously flows into the gap between close-fitting parts by capillary action an substantially completely fills this gap without leaving voids. A metallic element such as silver may be used as filler material. A variety of alloys may also be used as filler material or brazing structure depending on the intended use or application method. The filler material for a particular application may be chosen based on its ability to wet the materials to be connected, and melt at a lower temperature than the materials to be connected. Examples for such alloy type filler materials are copper-silver, copper-zinc, copper-tin, or gold-silver.

In the following, further exemplary embodiments of the packages, the device and the methods will be explained.

In an embodiment, at least one of the electrically conductive layers has a larger thickness than a thickness of the thermally conductive and electrically insulating core. By manufacturing the chip carrier by brazing, it becomes possible to provide very thick electrically conductive layers (in particular copper sheets). The thickness of an individual one of the electrically conductive layers may be even larger than a thickness of the thermally conductive and electrically insulating core. As a result, the heat removal capability of the chip carrier as a whole can be significantly improved, since a higher mass of thermally highly conductive copper material can be provided. Due to this improved heat spreading, it is also possible to operate the package with higher electric current values.

In an embodiment, at least one of the electrically conductive layers has a thickness of more than 0.4 mm, in particular more than 0.5 mm, more particularly more than 0.6 mm. The electrically conductive layers, in particular copper sheets, may even have a thickness of 0.8 mm or more, when being connected to the thermally conductive and electrically insulating core by brazing rather than by a eutectic method. In contrast to this, the thermally conductive and electrically insulating core may be a layer having a thickness of less than 0.4 mm, in particular less than 0.35 mm. The thermally conductive and electrically insulating core may even have a layer thickness below 0.3 mm.

In an embodiment, at least one of the electrically conductive layers is a metal layer, in particular a copper layer or an alloy comprising copper. Copper has a high thermal conductivity and properly adheres to mold material.

In an embodiment, the thermally conductive and electrically insulating core is a ceramic core. Thus, ceramic materials combining a high thermal conductivity with a reliable electric insulation property, may be implemented in a center of the chip carrier. For example, such a ceramic core may be a silicon nitride core. Other appropriate ceramic materials for the core are aluminium nitride or aluminium oxide. In particular, the thermally conductive and electrically insulating body may be made of a material having a thermal conductivity of at least 20 W/mK. For example, the thermal conductivity of the thermally conductive and electrically insulating body may be in a range between 20 W/mK and 200 W/mK.

In an embodiment, the package comprises a brazing structure or filler material, in particular comprising or consisting of silver, as a layer or pad between the thermally conductive and electrically insulating core and both of the electrically conductive layers. Such a brazing pad may be made of a filler material configured for interconnecting the thermally conductive and electrically insulating core with a respective one of the electrically conductive layers by brazing. For instance, the brazing structure may comprise silver or a silver alloy. The brazing structure may be made of a metallic paste.

In an embodiment, the chip carrier is an Active Metal Brazed (AMB) substrate. Active Metal Brazing may be denoted as a form of brazing which allows a metal to be joined to ceramic. An Active Metal Brazed (AMB) substrate may hence comprise a core of a ceramic isolator (in particular $Si_3N_4$, i.e. silicon nitride) onto which pure copper may be brazed in a high temperature vacuum brazing process. The use of an AMB substrate provides significant advantages in particular in the fields of automotive applications, traction, and high voltage DC transmission where high reliability, heat dissipation, and a secure protection against partial discharge are required. The high heat conductivity of silicon nitride (90 W/mK), as well as the high heat capacity and heat spreading provided by the thick copper layer (up to 0.8 mm or more) render AMB substrates highly appropriate for high power electronics applications. An AMB substrate allows forming a very thick copper metallization on a relatively thin silicon nitride ceramic which provides very high ampacity and very good heat spreading.

In an embodiment, at least part of a surface of the chip carrier being in contact with the encapsulant has an adhesion promoting surface. When the surface of the chip carrier, or at least a surface portion of the chip carrier in contact with the mold type encapsulant, is specifically adapted for promoting adhesion with a mold type encapsulant, the risk of delamination of the package may be additionally reduced and the mechanical integrity of the package may be further improved. In particular the surface of the electrically conductive layer inside of the encapsulation may be specifically treated for increasing adhesion.

For instance, the adhesion promoting surface comprises a roughened surface. Roughening before encapsulation has the advantage that the adhesion between the respective electrically conductive layer and the encapsulant material can be significantly improved. This efficiently suppresses delamination of the constituents of the package. Advantageously, surface roughening may be accomplished prior to attaching the electronic chip(s) to the chip carrier, since this protects the sensitive electronic chip against damage resulting from an interaction with a chemistry which may be advantageously used for roughening. Roughening may be accomplished, for example, by laser treatment, plasma treatment or chemical treatment of the respective surface to be roughened. In particular copper roughening is a powerful tool for improving adhesion between the respective electrically conductive layer and the mold compound.

Additionally or alternatively, the adhesion promoting surface may comprise an adhesion promoting coating, in particular an inorganic coating and/or an organic coating. Such an inorganic coating for promoting adhesion of a mold compound on the metallic surface of the respective electrically conductive layer may for example comprise coating with a metal oxide and/or an alloy such as zinc-chromium, molybdenum-chromium, or molybdenum-zinc. An example for an appropriate organic coating is silane.

In an embodiment, one of the electrically conductive layers facing the at least one electronic chip is covered by a sinter layer, in particular a patterned sinter layer. Thus, the chip may be mounted on the chip carrier by sintering via the sinter layer. It is also possible to use a sinter film attach process, whereby a sintered paste or film is pre-applied to a wafer (including multiple electronic chips being still integrally connected) prior to dicing. The wafer/sinter film stack may be mounted on dicing tape and sawn simultaneously prior to pick and place of the die/film stack.

Additionally or alternatively, one of the electrically conductive layers facing away from the at least one electronic chip is covered by a sinterable or sintered layer. For instance, a heat body or heatsink may be connected to the exterior surface of the respective one of the electrically conductive layers by sintering.

Establishing a sinter connection (in particular a silver sinter connection) on one or both of the mentioned positions of the package allows forming a mechanically reliable connection with a very thin sinter structure (for instance having a thickness of less than 50 µm, for example 30 µm) ensuring a proper thermal coupling for efficient heat conduction. The latter mentioned thicknesses are in particular appropriate when forming a sintered die bond interconnect. However, for a package to heatsink layer, the thickness of the sinter bond line may be significantly larger, for instance at least 100 µm. Such a larger thickness may enable the sinter joint to accommodate the warpage within the package. Moreover, such a sinter structure may be formed with highly homogeneous thickness, thereby preventing weak regions in terms of heat conductivity. Beyond this, a sinter connection may be established at a relatively low temperature (for instance below 300° C., for example around 250° C.), thereby protecting constituents of the package against damage due to thermal overload. In addition, while the sinter temperature is relatively low, undesired re-melting of a formed sinter connection is prevented up to a significantly higher temperature.

In an embodiment, at least two plate sections of the electrically conductive contact structure extend beyond the encapsulant and form power terminals for the electronic chip, and at least one lead section of the electrically conductive contact structure extends beyond the encapsulant and forms a signal terminal for the electronic chip. It is possible that the at least two plate sections extend at different, in particular opposing, side faces beyond the encapsulant. Moreover, it is possible that the at least one lead section extends at the same side face beyond the encapsulant as one of the at least two plate sections. For example, a thickness of the lead sections and/or the plate sections may be in a range between 200 µm and 800 µm, for instance between 300 µm and 600 µm.

In an embodiment, the at least one lead section and the one of the at least two plate sections extending at the same side face beyond the encapsulant are configured so that the at least one lead section is located in a recess of the other one of the at least two plate sections of an identical other package when the said plate sections of the packages are electrically connected. This allows for a compact mutual connection of different packages, for instance for forming a half-bridge.

In an embodiment, at least one of the at least two plate sections extends along at least 50%, in particular along at least 80% of a length of a side face of the encapsulant. Thus, a low ohmic configuration may be obtained without significantly increasing the dimensions of the package.

In an embodiment, at least one of the at least two plate sections comprises a locally raised bend portion, in particular having a wave profile. Such a wave profile or raised feature may enable a phase out interconnect and may contribute to stress relief of the package.

In an embodiment, the at least one lead section extends substantially perpendicular to the at least two plate sections. This results in a compact package design.

In an embodiment, at least one of the at least two plate sections is configured to be connected to a bus bar arrangement so that a magnetic flux associated with a current flowing into the package is coupled with magnetic flux of the current passing through the bus bar arrangement in opposite direction for an at least partial flux cancelation. This allows obtaining a package with low parasitic inductance.

In an embodiment, one of the electrically conductive layers facing away from the at least one electronic chip is attached to a heatsink. Attaching a heatsink to an exposed or exterior surface of the chip carrier allows improving the thermal performance of the package. In one embodiment, such a heatsink may be a cooling plate with cooling fins. In another embodiment, a fluid cooling (in particular water cooling) may be implemented in such an attached heatsink.

In an embodiment, the thermally conductive and electrically insulating core is configured for electrically insulating the at least one electronic chip with regard to an electronic environment of the package. In particular, any electrically conductive connection between an interior and exterior of the package may be disabled by the thermally conductive and electrically insulating core, while simultaneously enabling proper thermal coupling between an interior and exterior of the package.

In an embodiment, the chip carrier forms part of an exterior surface of the package. More specifically, one of the electrically conductive layers may form part of an exterior surface of the package, i.e. may extend beyond the encapsulant. This further improves the heat dissipation, heat removal as well as heat spreading capability of the package. In an embodiment, an exposed copper surface of the chip carrier may be covered with nickel, silver, gold, palladium or tin.

In an embodiment, the at least one electronic chip comprises at least one semiconductor power chip. For example, an insulated gate bipolar transistor (IGBT) chip may be provided as a switch. Additionally or alternatively, an electronic chip with an integrated diode may be provided.

In an embodiment, the package or the electronic device is configured as an inverter circuit. Such a power inverter may be denoted as circuitry that changes direct current (DC) to alternating current (AC). Advantageously, such an inverter may be implemented in a power train of a vehicle.

In an embodiment, the electrically conductive contact structure is a leadframe. The term "leadframe" may particularly denote an electrically conductive plate structure, in particular made of copper or an alloy of copper, which can serve to contact an electronic chip and which can thus accomplish a desired electric connection.

In an embodiment, the electrically conductive contact structure comprises at least one downholder section configured for pressing the chip carrier downwardly towards a mold tool during molding. Such a downholder section (in particular four downholder sections may be provided in four edge regions of the chip carrier) may be pins of the electrically conductive contact structure configured as clamps or springs. When pressed downwardly (for instance in a mold tool during encapsulation), the downholder section(s) may press the chip carrier downwardly so as to prevent that mold compound material flows beneath the chip carrier. By taking this measure, it can be securely ensured that, after encapsulation, at least a portion of the lower main surface of the package is formed by an exposed surface of one of the electrically conductive layers of the chip carrier. This, in turn, is advantageous in terms of proper heat removal from the interior of the package during operation thereof.

In an embodiment, it is possible that, during molding, a film is applied under the exposed metal layer to prevent overspill of mold material onto the exposed surface (film assisted molding).

In an embodiment, the package comprises electrically conductive elements, in particular at least one of bond wires, bond ribbons and clips, electrically connecting the at least one electronic chip with the electrically conductive contact structure and/or the chip carrier with the electrically conductive contact structure. A clip may be a three-dimensionally bent plate type connection element (which may for instance also be embodied as part of a leadframe) which has a respective planar section to be connected to an upper main surface of a respective electronic chip and an upper main surface of the chip carrier. Such a clip enables a very simple connection of the constituents of the package. As an alternative to such a clip, it is possible to use a bond wire or bond ribbon which is a flexible electrically conductive wire or ribbon shaped body having one end portion connected to the upper main surface of the respective electronic chip or chip carrier and having an opposing other end portion being electrically connected to the electrically conductive contact structure (for instance leadframe). A bond ribbon has the advantage of providing a higher current density per area as compared to wire bonding. This, in turn, allows obtaining a low parasitic inductance and a higher current carrying capability. A bond ribbon may for instance be made of aluminium or from a combination of aluminium and copper. It is possible that a bond ribbon or wirebond material is made of an alloy of aluminium.

In an embodiment, the encapsulant comprises a mold compound, in particular a resin-based mold compound. For the encapsulating by molding, a plastic material may be used. Preferably, the encapsulant may comprise an epoxy material. Filler particles (for instance $SiO_2$, $Al_2O_3$, $Si_3N_4$, BN, AlN, diamond, etc.), for instance for improving thermal conductivity may be embedded in an epoxy-based matrix of the encapsulant.

In embodiments, the module or package may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the module or package is configured as one of the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin Small Outline Package (TSOP) electronic component. Therefore, the package according to an exemplary embodiment is fully compatible with standard packaging concepts (in particular fully compatible with standard TO packaging concepts) and appears externally as a conventional electronic component, which is highly user-convenient. In an embodiment, the package is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology, in GaN on silicon, or on GaN on SiC carbide substrates.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 2 shows a side view of the package according to FIG. 1.

FIG. 3 shows a top view of the package according to FIG. 1.

FIG. 4 shows a bottom view of the package according to FIG. 1.

FIG. 7 shows a preform of a package according to an exemplary embodiment prior to encapsulating.

FIG. 8 shows a top view of a chip carrier of a package according to an exemplary embodiment with a patterned layer of sinterable material.

FIG. 11A, FIG. 11B, and FIG. 11C show different Active Metal Brazed (AMB) substrate supply formats for a package according to exemplary embodiments.

FIG. 14 shows a package according to another exemplary embodiment with sideways formed leads.

DETAILED DESCRIPTION OF EXEMPLARY EMBODIMENTS

Figure 1:
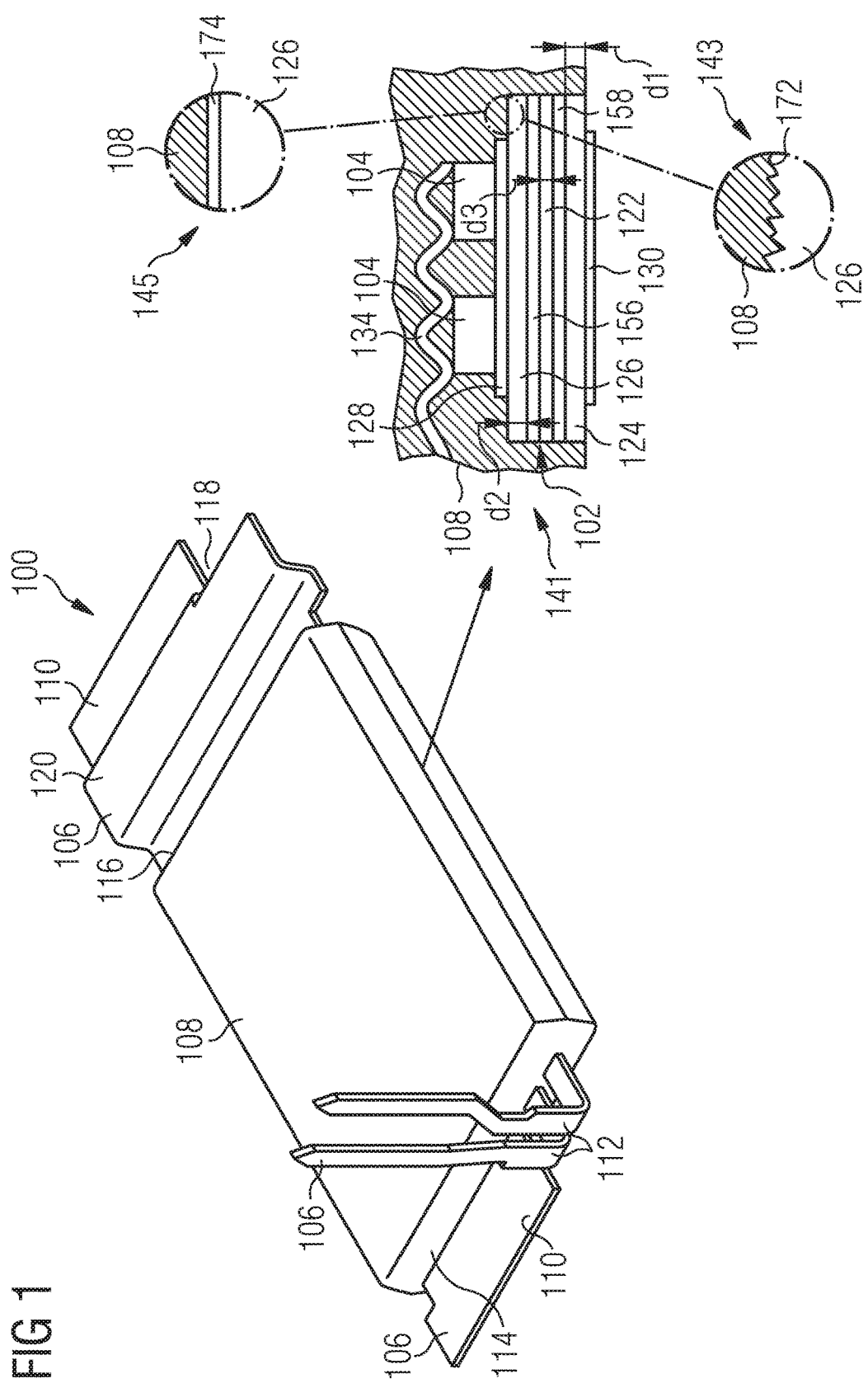
FIG. 1 shows a three dimensional view of a package according to an exemplary embodiment.

The illustration in the drawing is schematically.

Before describing further exemplary embodiments in further detail, some basic considerations of the present inventors will be summarized based on which exemplary embodiments have been developed.

A range of power inverter technologies are publicly known. An inverter circuit may include a combination of a gate drive circuit, power semiconductor devices and some form of electric isolation between the semiconductor devices and external cooling arrangements. To enable the semiconductors to be connected to external circuitry, and effectively cooled, a variety of solutions are used. These include: Discrete IGBT devices mounted onto insulating dielectrics, plastic encapsulated leadframe and DCB based modules, framed module technologies containing wire bonded DCB assemblies soldered onto metal baseplates, etc.

According to an exemplary embodiment, a compact low inductance IGBT package for electric vehicle inverters is provided with inbuilt electrical isolation and a very low junction-to-heatsink thermal resistance. In order for the package to be used in circuit, it may also be advantageous when the package is easily connected to external power bus bars, gate drive control circuitry and heatsink. Highly advantageously, a chip carrier of a corresponding mold-type encapsulation package may be composed of a thermally conductive an electrically insulating core (preferably made of a ceramic) and two electrically conductive layers (preferably thick copper sheets) brazed onto the core via respective brazing structures (preferably comprising or consisting of silver). This allows obtaining a high mechanical reliability, a high electric reliability and a proper thermal performance.

In particular, an exemplary embodiment provides a high power low inductance package with inbuilt electrical isolation. In other words, an exemplary embodiment makes it possible to create a low inductance IGBT package for electric vehicle inverters with inbuilt electrical isolation and very low junction-to-heatsink thermal resistance. Such a package can also be easily connected to an electronic environment, in particular external bus bars and circuitry.

A low inductance behavior may be achieved by the combination of wide emitter and collector power leads combined with internal ribbon bonded interconnects. The wide power terminals may be soldered or welded to a bus bar arrangement. The bus bars may be positioned over the package to enable low inductance current paths. The magnetic flux associated with the current flowing into the package may be coupled with the magnetic flux of the current passing through the bus bars in the opposite direction. This may result in partial or complete flux cancelation, and a low effective parasitic inductance.

Wide emitter and collector terminals of the package may be configured so that two packages can be welded or soldered together to form a compact half-bridge with low parasitic interconnects.

In an embodiment, a low junction-to-heatsink thermal resistance may be obtained by one or any desired combination of the following measures:

a) sintered die attach joints;

b) high conductivity $Si_3N_4$ Active Metal Brazed (AMB) substrate with thick copper layers on both sides of the ceramic core. The latter allows for thermal spreading. Brazing the copper layers on the ceramic core at a temperature of at least 600° C. (rather than soldering, or forming an eutectic connection) allows preventing the formation of air gaps between ceramic core and copper layers; thereby, partial discharge may be suppressed, which renders the package highly appropriate for high voltage applications c) a sinterable metallization on the back of the AMB substrate (in particular using silver for sintering)

d) sintering the package onto a heatsink assembly

Inbuilt isolation may be achieved in a reliable way by using a silicon nitride dielectric as thermally conductive and electrically insulating core of the chip carrier. Such a silicon nitride dielectric has a high thermal conductivity and dielectric strength.

Exemplary embodiments may be designed to enable a low inductance, low resistance, high power density inverter for electric vehicle and other high power applications.

An exemplary embodiment of the package may use a combination of a sintered die attach, low inductance electrical interconnects and a sinterable exposed metalized substrate to create a low resistance, low inductance package with inbuilt isolation for high power inverter applications. The package leads may be designed to enable two packages to be welded together to form a compact electronic device with half bridge function and provide areas that can be welded to bus bars.

An advantage of a package according to an exemplary embodiment is that it has very low inductance, low thermal resistance and inbuilt isolation.

Leads on the package may be designed so that they can be welded to form a very compact half bridge.

A package according to an exemplary embodiment can be paralleled to create inverters, and other power applications, with a range of power levels (packages can be paralleled to further increase the current rating).

In particular the combination of low thermal resistance, low inductance and small form factor may provide a compact and efficient package with low weight and volume.

FIG. 1 shows a three dimensional view of a package 100 according to an exemplary embodiment. FIG. 2 shows a side view of the package 100 according to FIG. 1. A schematic first detail 141 shows a cross-section of a portion of the package 100. A second detail 143 is an enlarged view of a portion of detail 141 and shows an interface between a chip carrier 102 and an encapsulant 108. A third detail 145 shows an alternative to the configuration of the second detail 143 and is also an enlarged view of a portion of detail 141 showing an interface between chip carrier 102 and encapsulant 108.

The package 100 according to FIG. 1 and FIG. 2 is configured as a power semiconductor module and comprises a chip carrier 102 embodied as Active Metal Brazed (AMB) substrate. As can be taken from the first detail 141, two electronic chips 104, which are here embodied as power semiconductor chips, are mounted on the chip carrier 102. A leadframe type electrically conductive contact structure 106 is electrically coupled with the electronic chips 104 by electrically conductive elements 134 such as bond ribbons (for details see also FIG. 7).

An epoxy resin based mold-type encapsulant 108 encapsulates part of the electrically conductive contact structure 106, part of the chip carrier 102 and the entire electronic chips 104.

As can be taken from the first detail 141, the AMB substrate type chip carrier 102 comprises a central thermally conductive and electrically insulating core 122 embodied as a ceramic such as silicon nitride. The thermally conductive and electrically insulating core 122 is configured for electrically insulating the electronic chips 104 with regard to an environment of the package 100, while simultaneously contributing to the removal of heat from the electronic chips 104 to the environment. The core 122 is covered on both opposing main surfaces thereof by a respective brazed electrically conductive layer 124, 126. The electrically conductive layers 124, 126 are here embodied as thick copper sheets (for instance having a respective thickness, d1 or d2, of 0.8 mm). The electrically conductive layers 124, 126 are brazed at a temperature of above 600° C. to the core 122 with a respective brazing structure 156, 158 in between. The brazing structures 156, 158 may for instance be a silver paste or a silver alloy paste. In view of the brazing connection, an undesired but conventionally occurring formation of air gaps between core 122 and electrically conductive layers 124, 126 can be securely prevented. This increases the protection of the package 100 against partial discharge and allows operation of the package 100 with very high voltages.

As can be taken from the first detail 141, each of the electrically conductive layers 124, 126 has a larger respective thickness d1, d2 compared to a smaller thickness d3 (for instance 0.32 mm) of the thermally conductive and electrically insulating core 122. The larger copper thicknesses d1, d2 of the electrically conductive layers 124, 126 promote efficient heat removal from the electronic chips 104 during operation of the package 100, since copper is highly thermally conductive.

Now referring to the second detail 143 and the third detail 145, respectively, at least the metallic surface portion of the chip carrier 102 being in contact with the mold-type encapsulant 108 has an adhesion promoting surface. In case of the embodiment illustrated as second detail 143, this adhesion promoting surface is formed by roughening a surface 172 of electrically conductive layer 126, for instance by a plasma treatment, a laser treatment or a chemical treatment. Roughening increases the effective coupling area between electrically conductive layer 126 and encapsulant 108 and thereby improves adhesion. In case of the embodiment illustrated as third detail 145, the adhesion promoting surface is formed by an adhesion promoting coating 174 (for instance an inorganic coating comprising a metal oxide, a galvanically deposited zinc-chromium alloy, etc., and/or an organic coating, for example silane). Roughening and formation of an adhesion promoting coating 174 may also be combined. By providing an adhesion promoting surface, the adhesion between the chip carrier 102 and the encapsulant 108 may be further improved. This additionally suppresses any risk of delamination and therefore improves both the electrical and mechanical reliability of the package 100.

As can also be taken from the first detail 141, the upper electrically conductive layer 126 facing the electronic chips 104 and being completely arranged within the encapsulant 108 is covered by a sinter layer 128 which may have a small and homogeneous thickness of for instance 30 μm and which may establish a thermally properly conductive connection between the electronic chips 104 on the one hand and the chip carrier 102 on the other hand. Although sinter layer 128 is illustrated as a continuous layer (i.e. as a single layer under both electronic chips 104) in detail 141, it is also possible to split such a single sinter layer 128 into two (or more separate) deposits, for instance of silver. Correspondingly, the lower electrically conductive layer 124 forming part of an exterior surface of the package 100 and thereby facing away from the electronic chips 104 comprises a sinterable (i.e. being not yet sintered, but being capable of forming a sinter connection, for instance for connecting a heatsink 132 illustrated in FIG. 2) or already sintered (for instance with such a heatsink 132) layer 130. In other words, the electrically conductive layer 124 facing away from the electronic chips 104 can be attached to heatsink 132 via layer 130 for further improving heat dissipation performance.

Now referring to the configuration of the electrically conductive contact structure 106 particularly outside of the encapsulation 108, FIG. 1 and FIG. 2 show two plate sections 110 of the electrically conductive contact structure 106 which extend beyond the encapsulant 108 and form power terminals for the electronic chip 104. Moreover, two lead sections 112 of the electrically conductive contact structure 106 extend beyond the encapsulant 108 and form signal terminals for the electronic chip 104. More specifically, the plate sections 110 extend at opposing side faces 114, 116 beyond the encapsulant 108. In contrast to this, the lead sections 112 extend at the same side face 114 beyond the encapsulant 108 as one of the plate sections 110. The lead sections 112 and the one of the two plate sections 110 extending at the same side face 114 beyond the encapsulant 108 are configured so that the lead sections 112 are located in a recess 118 of the other opposing plate section 110 of an identical other package 100 when these two plate sections 110 of the packages 100 are electrically connected. One of the two plate sections 110 extends along more than 80% of a length of a side face 114, 116 of the encapsulant 108. One of the two plate sections 110 comprises a locally raised bend portion 120 having a wave profile for stress relief. End portions of the lead sections 112 extend perpendicular to the two plate sections 110. The two plate sections 110 are further configured to be connected to a bus bar arrangement (not shown) so that a magnetic flux associated with a current flowing into the package 100 is coupled with magnetic flux of the current passing through the bus bar arrangement in opposite direction for an at least partial flux cancelation. This keeps the parasitic inductance of the package 100 small.

FIG. 1 illustrates an outline and FIG. 2 illustrates a side view of the low inductance package 100. Hence, FIG. 1 and FIG. 2 show a three-dimensional and a sideways-on view of the package 100, respectively. The package 100 is configured as an overmolded (see encapsulant 108) leadframe-based (compare electrically conductive contact structure 106) package 100 containing an isolating dielectric substrate as chip carrier 102. The power leads in form of the plate sections 110 are designed to maintain a large cross sectional area for current flow and to keep the parasitic resistance and inductance in circuit small. The control electrodes in form of the lead sections 112 protrude perpendicular to the power terminals so that they can be connected to an external gate drive circuit that may be positioned above the power device type package 100 in application.

With reference to FIG. 2, the larger of the power leads contains a raised geometric bend feature, see reference numeral 120. This serves dual purposes: firstly to provide a mechanical stress relief feature when packages 100 are connected to other elements of the circuit; secondly to provide a surface for connecting a bus bar (not shown).

FIG. 3 shows a top view of the package 100 according to FIG. 1. FIG. 4 shows a bottom view of the package 100 according to FIG. 1. The top surface of the package 100 is flat and co-planar with the back surface of the package 100. The back side of the package 100 has an exposed metalized surface that is designed for interfacing with heatsink 132. The exposed metalized surface is part of the chip carrier 102 configured as active metal brazed circuit onto which the electronic chips 104, embodied as power semiconductor dice, are mounted. The exposed surface may be finished in a material (compare layer 130) that is suitable for connecting the package 100 to heatsink 132. To obtain a very low thermal resistance, a silver sintered interconnect can be formed using layer 130. Alternatively, other thermal interface materials such as thermal grease or solder can be used. When a silver sintered interconnect is used, which can be provided by layer 130, a preferred finish on the back of the exposed substrate is silver, gold or palladium (i.e. an inert metal). In another embodiment, it is further possible to omit selectively silvered AMB finish and sinter to bare copper.

With reference to FIG. 4, the exposed metalized surface is separated from the power and control terminals (compare reference numerals 110, 112) in order to obtain a high creepage distance in application.

Figure 5:
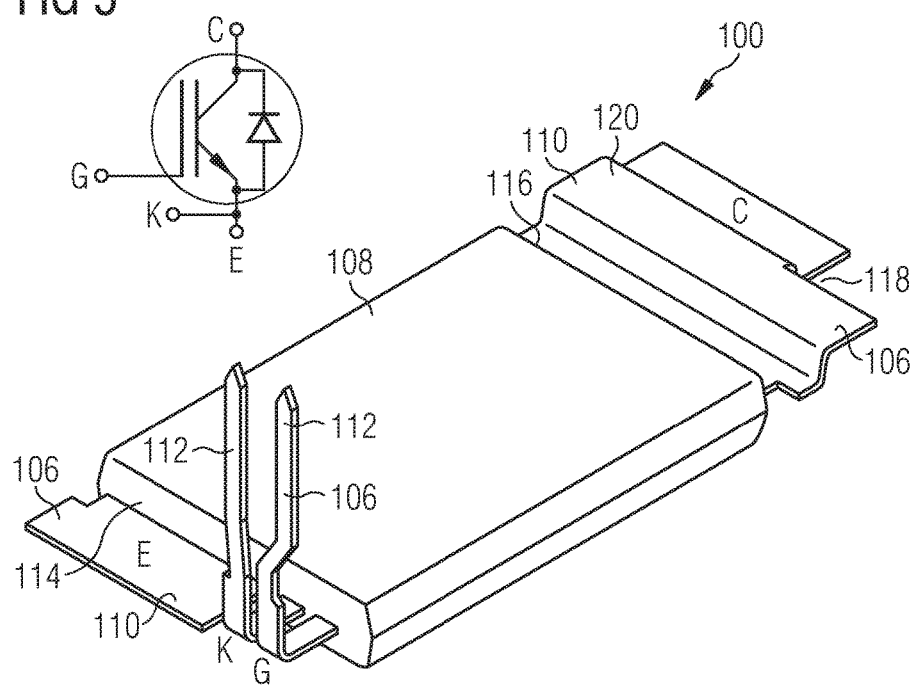
FIG. 5 shows a three dimensional view of the package according to FIG. 1 illustrating electrical connections.

FIG. 5 shows a three dimensional view of the package 100 according to FIG. 1 to FIG. 4 showing electrical connections of the plate sections 110 and the lead sections 112. In the shown embodiment, the pin designation is as follows: E: Emitter (power terminal); K: Kelvin (control terminal, Emitter Sense); G: Gate (control terminal); C: Collector FIG. 5 shows the pin out configuration of the package 100 when configured as an IGBT device.

Figure 6:
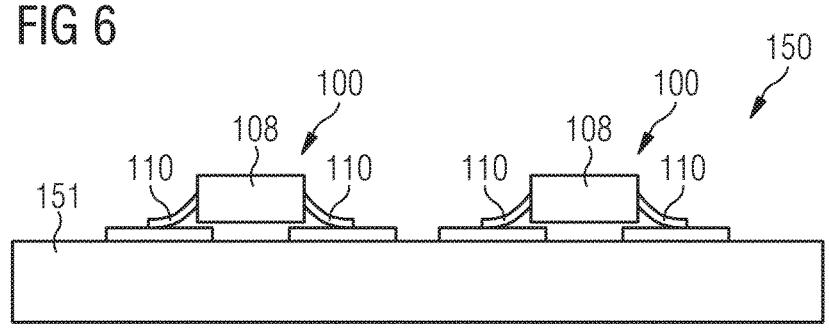
FIG. 6 shows a side view of an electronic device composed of two interconnected packages according to an exemplary embodiment.

FIG. 6 shows a schematic side view of an electronic device 150 composed of two interconnected packages 100 according to an exemplary embodiment. One of the power terminals (compare reference numeral 110) of one of the packages 100 may be electrically coupled with one of the power terminals (compare reference numeral 110) of the other one of the packages 100. According to FIG. 6, the two packages 100 are mounted on a mounting base 151 (such as a printed circuit board). Alternatively, it is also possible to couple the two packages 100 directly (i.e. without mounting base 151). For example, the electronic device 100 may form a compact, low inductance half-bridge.

FIG. 7 shows a preform of package 100 according to an exemplary embodiment prior to encapsulating. Descriptively speaking, the preform illustrated in FIG. 7 corresponds to the package 100 of FIG. 1 without encapsulant 108.

FIG. 1 in particular shows the detailed configuration of the already mentioned electrically conductive elements 134, here comprising a combination of bond wires and bond ribbons. The electrically conductive elements 134 electrically connect the electronic chips 104 with the electrically conductive contact structure 106 and the electrically conductive contact structure 106 with the electrically conductive layer 126 of the chip carrier 102.

Particular reference is now made to four clamp-like downholder sections 154 of the electrically conductive contact structure 106 which are configured for pressing the chip carrier 102 downwardly towards a mold tool during molding, to disable an undesired flow of the not yet hardened encapsulant 108 to a bottom surface of the package 100 formed by the chip carrier 102.

Thus, FIG. 7 shows the internal construction of the package 100. The package 100 in the shown embodiment contains an IGBT chip and a diode chip as electronic chips 104 formed in semiconductor technology. The diode die and the IGBT die, as the electronic chips 104, are attached to the chip carrier 102 using a sintered die attach material (compare reference numeral 128). This enables a very low thermal resistance interconnect between the electronic chips 104 and the chip carrier 102. The sinter joint formation may advantageously result in a joint with thermal conductivity in the range of 150 W/mK to 300 W/mK. This is significantly higher than that achievable with solder die attach technologies that have conductivities of typically less than 60 W/mK.

The chip carrier 102 which is advantageously formed as Active Metal Brazed (AMB) substrate provides several advantages within the package 100: (a) it provides electrical isolation between the back of the package 100 and the electronic chips 104, (b) it provides an electrical interconnect between the collector and cathode of the electronic chips 104, (c) it provides a thick copper layer in form of electrically conductive layer 126 under the electronic chips 104 to spread heat, (d) it provides a thermal path between the electronic chips 104 and the back of the package 100, (e) it prevents the formation of undesired air gaps between core 122 and electrically conductive layers 124 and 126 respectively, therefore provides a reliable protection against partial discharge phenomena. The thickness and composition of the stack constituting the chip carrier 102 used in the package 100 are 0.8 mm Cu/0.32 mm $Si_3N_4$/0.8 mm Cu.

The AMB substrate forming the chip carrier 102 comprises a silicon nitride ($Si_3N_4$) dielectric, as core 122, with a thermal conductivity of approximately 90 W/mK. This is significantly higher than that of $Al_2O_3$ dielectrics whose thermal conductivity is typically in the range of 24 W/mK to 26 W/mK. The use of an AMB substrate as chip carrier 102 therefore results in a package 100 with lower thermal resistance junction to case ($R_{th\ j-c}$). The brazing process and higher fracture toughness of the AMB substrate enable a thicker copper layer to be applied to the substrate (for instance 0.8 mm). This allows for increased heat spreading underneath the electronic chips 104, being here embodied as power semiconductor dice, and reduced electrical conduction losses in the current path between the back of the two electronic chips 104 and the collector terminals.

FIG. 8 shows a top view of a chip carrier 102 of a package 100 according to an exemplary embodiment with a patterned layer 128 of sinterable material.

FIG. 8 shows the design of the AMB substrate used in the present embodiment as chip carrier 102. The substrate top copper layer constituting electrically conductive layer 126 is embodied as one continuous layer with four corners 153 etched to allow space for the leadframe touch down areas, i.e. the downholder sections 154, described in more detail below. The top copper tracking layer constituting electrically conductive layer 126 has a silver metalized finish (see layer 128) applied to enable the use of silver sintered die attach technology. The silver region according to layer 128 may be advantageously applied only where it is required. For example, the silver material of layer 128 may be only applied in regions where the sintered die attach materials are to form a contact. All other regions may be kept free of silver as resin based, in particular epoxy resin based, molding compounds used as encapsulant 108 to encapsulate the constituents of the package 100 may adhere better to bare copper than to silver. The silver finish according to layer 128 may have a thickness in the range between 0.1 µm to 0.5 µm, and may optionally contain an under layer of nickel. For silver sintering, it is also possible to use a gold or palladium finish on the AMB surface.

Referring again to FIG. 7, the internal construction of the package 100 may use ribbon bonds as electrically conductive elements 134 to form the electrical interconnects between the collector lead and AMB copper tracking. In the described embodiment, it is for instance possible to use three 2 mm×0.3 mm aluminium bonds for the collector interconnect. The ribbon bonds provide a low resistance and low inductance interconnect. One additional advantage of using a ribbon bonding process is that the bonding process can accommodate the relatively large thickness variation of the AMB substrate which may for instance be ±10%.

Ribbon bond interconnects may also be used as electrically conductive elements 134 to provide low inductance and low resistance electrical interconnects between the emitter electrode on the IGBT and the emitter power pin. In this case, the package 100 may implement two 2 mm×0.3 mm aluminium bonds to form the interconnects. In an embodiment, the ribbon bonds may connect both the IGBT emitter and diode anode electrodes to the emitter pin using a combination of stick bonds. Use of the ribbon bonds offers a large cross sectional area for conduction and fast process speeds compared to aluminium wires (since less ribbon bonds are sufficient compared to wires). Ribbon bonds also enable semiconductor dice to be used with less complex top metal structures compared to other interconnect technologies.

Accommodating a thickness tolerance of an AMB substrate as chip carrier 102 can also be considered during the overmolding process, by which the encapsulant 108 is formed. If the mold tool is set up to accommodate an AMB substrate as chip carrier 102 at an upper thickness specification, the use of a thinner chip carrier 102 may result in a gap under the package 100 during the molding process and in excessive transfer of mold compound onto the exposed AMB substrate type chip carrier 102. It is however advantageous that the back of the AMB substrate, i.e. electrically conductive layer 124 or layer 130 formed thereon, is free of mold bleed or flash if a sintering process is to be successful during attaching the heatsink 132. With this in mind, the leadframe type electrically conductive contact structure 106 of the package 100 can be designed with touch down features on the leadframe in form of downholder sections 154 (compare FIG. 7). These downholder sections 154 may apply pressure onto the four corners 153 of the chip carrier 102, i.e. the AMB substrate in the present embodiment, during the molding process and press the AMB substrate onto the mold tool when the tool is closed. This prevents excessive mold flash and resin bleed onto the back of the exposed chip carrier 102. The touch-down features in form of downholder sections 154 may also act as springs and may be able to accommodate the thickness variation of the chip carrier 102 when embodied as AMB substrate.

Figure 9:
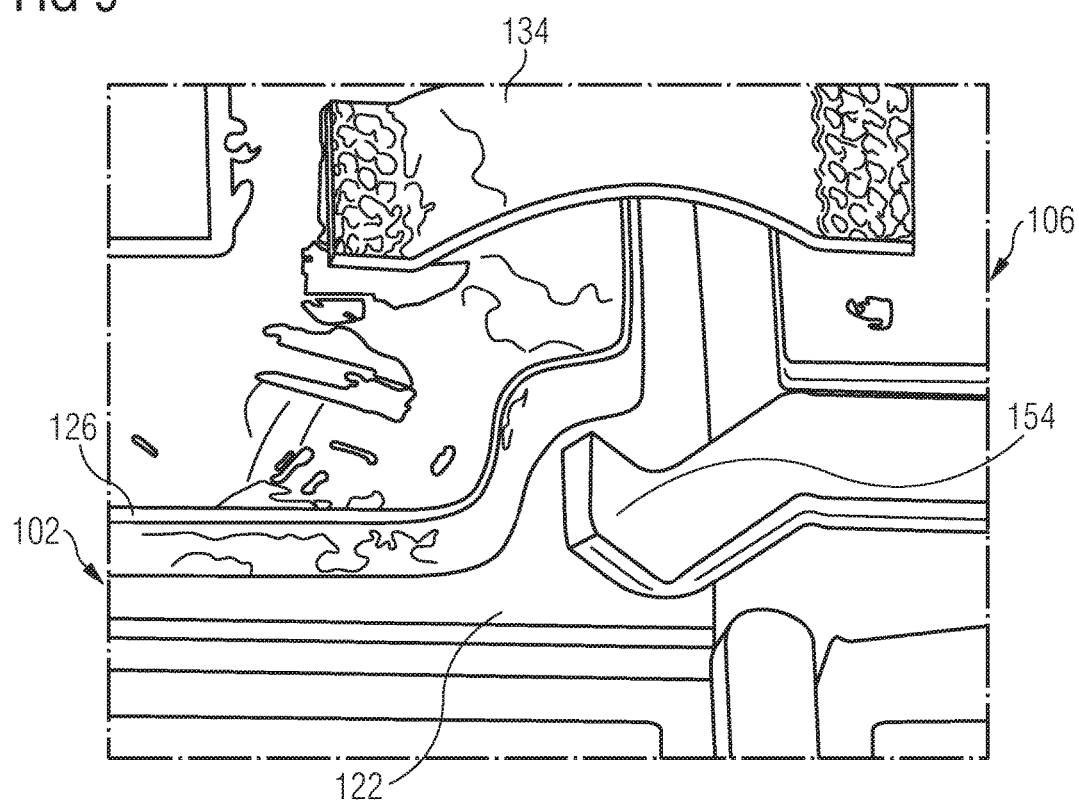
FIG. 9 shows a close-up image of a leadframe touchdown region of a package according to an exemplary embodiment.

FIG. 9 shows a close-up image of a leadframe touchdown region, here embodied as downholder section 154, of a package 100 according to an exemplary embodiment.

Figure 10:
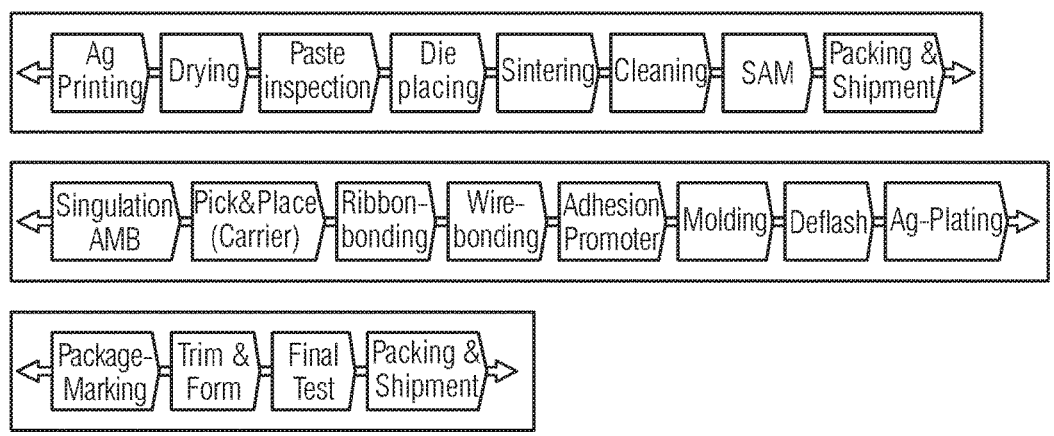
FIG. 10 shows a process flow of a method of manufacturing a package according to an exemplary embodiment.

FIG. 10 shows a process flow of a method of manufacturing a package 100 according to an exemplary embodiment. FIG. 10 illustrates the high level process flow used to manufacture the low inductance semiconductor package 100. However, alternatives to the shown process flow are possible in other embodiments. For instance, one or more additional process stages may be used prior to the adhesion promotor stage. For example, a plasma clean process may be used to prepare the surface prior to application of the adhesion promotor.

Figure 11A:
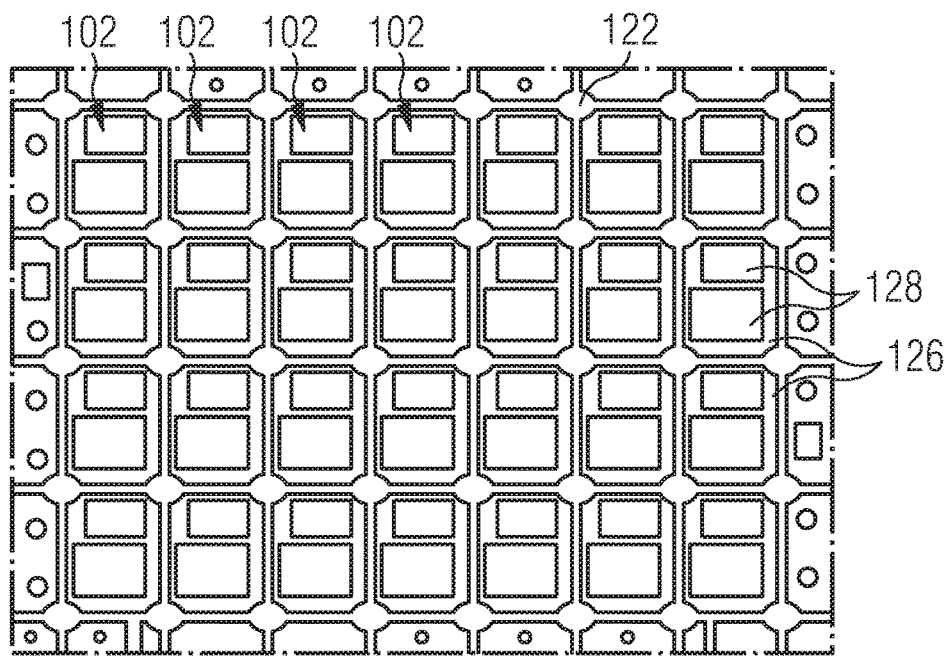
Figure 11B:
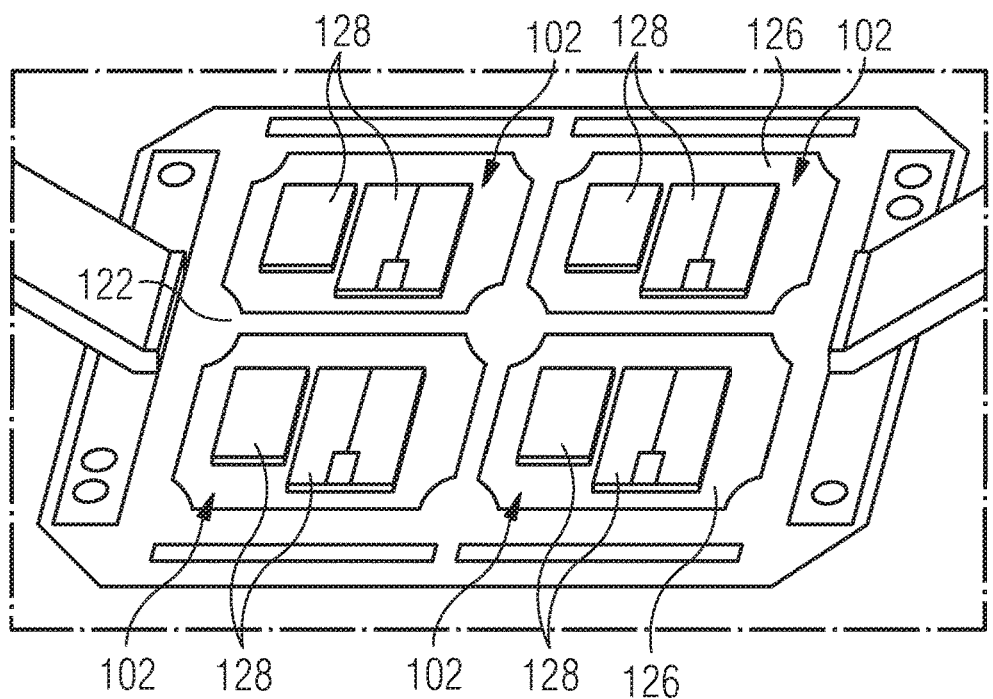

FIG. 11A, FIG. 11B, and FIG. 11C show different Active Metal Brazed (AMB) substrate supply formats as chip carrier 102 for a package 100 according to exemplary embodiments. The AMB substrates used in the manufacture of the package 100 as chip carrier 102 can be supplied in singulated units or arrays of circuits on a subpanel or mastercard. FIG. 11A to FIG. 11C show circuit formats which may be used. A certain choice of substrate may be made depending on panel yield, singulation method used and manufacturing lines available.

Figure 12:
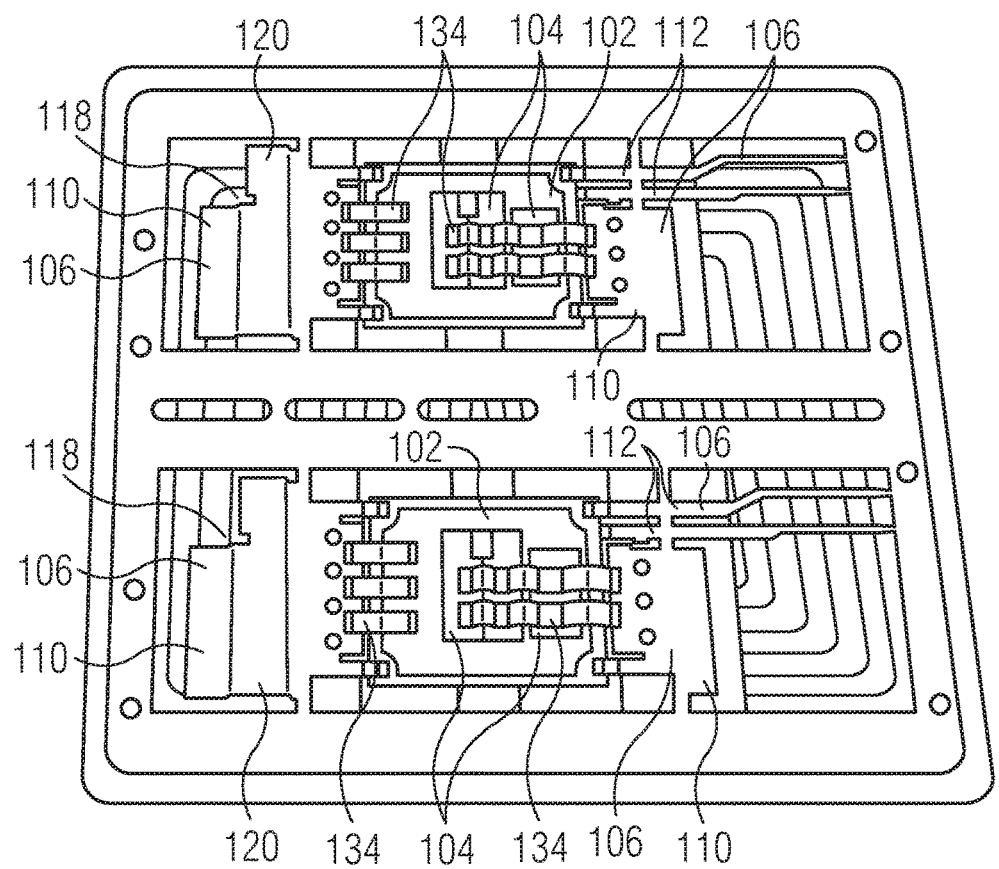
FIG. 12 shows a leadframe placed onto an AMB/die assembly on a support structure for ribbon and wire bonding for forming a package according to an exemplary embodiment.

FIG. 12 shows a common leadframe, as preform of the electrically conductive contact structures 106, placed onto an AMB substrate/die assembly (i.e. chip carriers 102 with electronic chips 104 mounted thereon) on a support structure for the ribbon and wire bonding (i.e. for forming the electrically conductive elements 134) for forming a package 100 according to an exemplary embodiment.

The shown leadframe is a two up version. It is possible that the leadframe accommodates ten or more units per strip.

For forming the sinter layers 128, sinter paste can be printed onto the AMB substrate, as chip carrier 102, for instance using stencil printing or screen printing. After the sinter paste has been applied to the substrate, the assembly may be dried in air to remove solvent from the paste. After drying the paste, the electronic chips 104 may be placed onto the sinter paste constituting the sinter layer 128 using a die bonder. The die bonder may be equipped with a hot pick up tip and heated chuck to increase the adhesion of the electronic chips 104 to the dried paste constituting sinter layer 128.

The die/substrate assembly may then be placed into a sinter press. During sintering both temperature and pressure may be applied simultaneously to the front and back of the assembly. Sinter pressures can be in the range of 8 MPa to 30 MPa. Sinter temperatures may be in a range of 200° C. to 250° C.

It is however also possible to place the die or electronic chip 104 into a wet sinter paste and dry the assembly before applying pressure.

After sintering, the assembly may be cleaned to remove copper oxide from the AMB surface and any residues present on the die surfaces. Circuit assemblies may then be singulated into individual circuits. This can be done, for example, using scribe and break processes, mechanical or laser dicing. The individual circuits may then be assembled into a carrier structure. A leadframe, as electrically conductive contact structure 106, may be placed onto the AMB assembly prior to ribbon bonding. FIG. 12 shows a carrier structure which may be used for the ribbon bonding process.

During ribbon bonding (more generally formation of the electrically conductive elements 134), three 2 mm×0.3 mm ribbon bonds may be applied between the collector lead and the AMB copper tracking. Moreover, two 2 mm×0.3 mm ribbon bonds may be formed between the IGBT emitter, diode anode and emitter pins.

Leadframes may then be transferred into a cassette for wire bonding. During wire bonding, 14 mil diameter aluminium wires may be used to connect the gate and emitter sense leads to their respective pads on the electronic chips 104 serving as IGBT die. An adhesion promotor may be applied to the assembly at this stage to improve the adhesion of mold compound type encapsulant 108 to the AMB/Die/leadframe assembly. Measures which can be taken for promoting adhesion are surface roughening and/or covering a connection surface with an inorganic coating. Adhesion promotion may also be accomplished by an organic coating, for instance by silane.

The preforms of the packages 100 may then be overmolded for forming the encapsulant 108. For example, a tape based molding process may be used in order to further reduce resin bleed and mold flash transferring onto the exposed surface of the chip carrier 102. The exposed surface of the chip carrier 102 may then be cleared of mold flash and resin bleed using a deflash process. This can involve chemical processing, media abrasion, a laser based process or a combination thereof.

In order to prepare the exposed AMB substrate with a package external surface that is suitable for sintering, the assemblies may then be subjected to silver plating for forming sinterable layer 130. The silver plating thickness applied may for example be in a range between 0.1 μm and 0.45 μm. Samples may then be subjected to laser mark, trim/form and singulation operations and may be transferred into a carrier structure for final testing. During electrical test, a combination of static, dynamic and isolation tests may be performed. Samples passing this test are then packed and shipped in trays for further use.

Figure 13A:
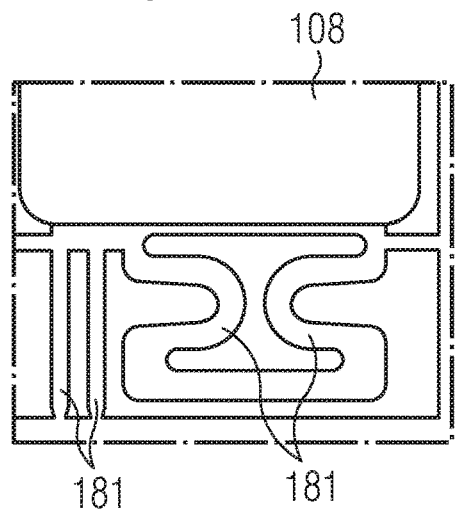
FIG. 13A and FIG. 13B show two embodiments of leads enabling flexing in operation of a package for stress relief according to an exemplary embodiment.
Figure 13B:
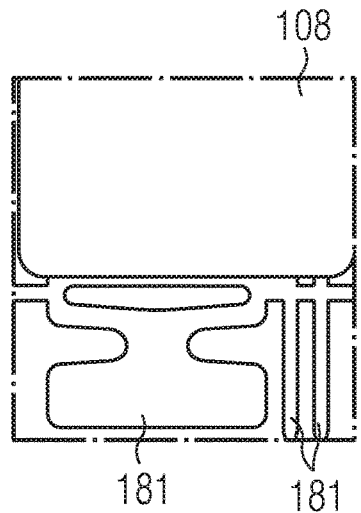

FIG. 13A and FIG. 13B show two embodiments of leads 181 enabling flexing in operation of a package 100 according to an exemplary embodiment. The lead design according to FIG. 13A and FIG. 13B may contribute to stress relief. The raised mechanical stress relief feature shown in FIG. 2 (compare reference numeral 120) may be replaced with a flat two dimensional structure with geometries as shown in FIG. 13A and FIG. 13B. These features may result in improved mechanical stress relief and lower manufacturing costs for the leadframe-type electrically conductive contact structure 106. Hence, FIG. 13A and FIG. 13B illustrate alternative designs of leads 181 that enable the leads 181 to flex whilst in operation.

FIG. 14 shows a package 100 according to another exemplary embodiment with sideways formed end portions of lead sections 112.

The width, L, of the leadframe design according to reference numeral 185 in FIG. 14 is relatively large due to the space required to accommodate the vertical gate and emitter sense leads (compare lead sections 112 on the right-hand side of FIG. 14, see reference numeral 189). By changing the position of these leads in the way as illustrated with reference numeral 187 in FIG. 14, it is possible to use a leadframe with a reduced width, l. Descriptively speaking, it is possible to bend the leads in the east-west direction (compare reference numeral 187) as opposed to the design where the leads are bent in the north-south direction (compare reference numeral 185). Thus, the embodiment according to reference numeral 187 in FIG. 14 provides sideways formed leads to improve packing density of the leadframe.

Figure 15:
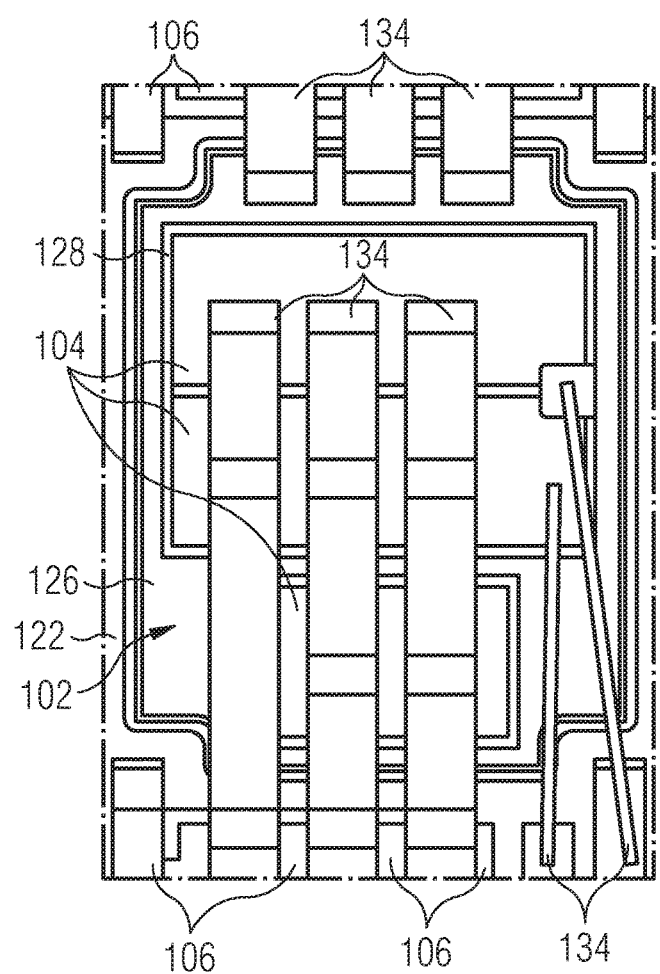
FIG. 15 shows a preform of a package according to another exemplary embodiment with three chip connecting ribbons.

FIG. 15 shows a preform of a package 100 according to another exemplary embodiment with three ribbons as electrically conductive elements 134. The embodiment of FIG. 15 is particularly appropriate for high-power applications.

The power handling capability of the package 100 according to FIG. 15 can be improved by increasing the die size of the electronic chip 104 embodied as IGBT. It is possible to modify the width of the electronic chip 104 to enable a third ribbon bond as additional electrically conductive element 134 to be placed on the electronic chip 104 constituting the IGBT die, as shown in FIG. 15. In a scenario in which it is difficult to place a third bond on the diode anode electrode, the third bond can be configured to jump over the diode and make direct contact to the IGBT electrode.

Additional options to reduce resistance of collector and emitter interconnects in exemplary embodiments include:

1. Using double ribbons (for example bridge one ribbon with a second ribbon), create parallel path for current and cut resistance in half 2. Use of aluminium clad copper ribbons to enable a lower resistance ribbon bond. Copper has significantly lower resistivity that aluminium.

3. Replacement of ribbons with aluminium clad copper wires. As above, copper/aluminium clad wires have a very low resistivity.

4. Replacement of ribbons with copper wires (in this scenario, an additional top metallization may be provided)

In addition, implementing aluminium clad copper wires may result in further improved reliability in power cycling.

Figure 16A:
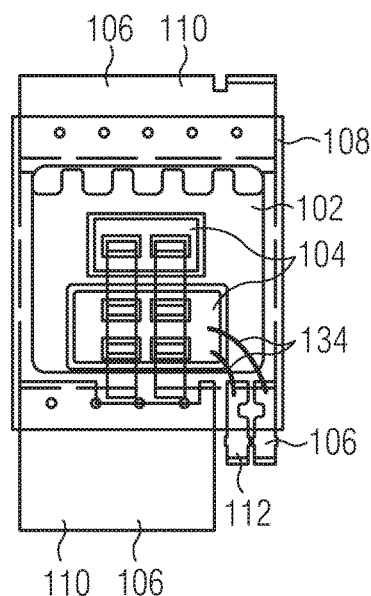
FIG. 16A, FIG. 16B and FIG. 16C show preforms of a package according to other exemplary embodiments in which collector ribbons are substituted with welded collector pins.
Figure 16B:
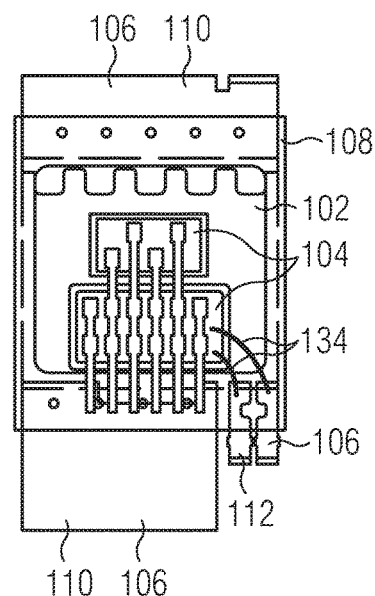
Figure 16C:
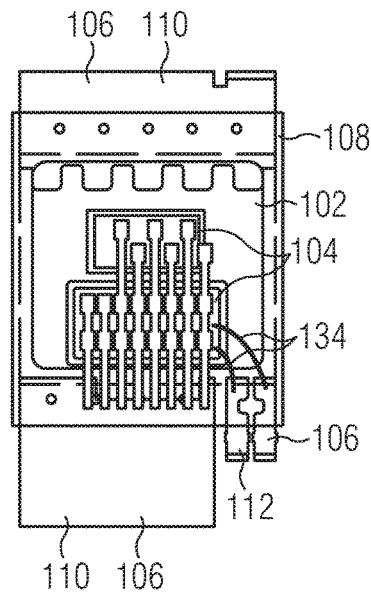

FIG. 16A, FIG. 16B and FIG. 16C show preforms of a package 100 according to other exemplary embodiments in which collector ribbons are substituted with welded collector pins.

Options for reducing the collector interconnect resistance include replacing the collector ribbon bonds with welded leads. FIG. 15 illustrates such a concept. It may be advantageous that the regions of the collector that contact the AMB substrate may be made flexible to accommodate the thickness tolerance of the AMB substrate. This can be achieved for example by reducing the thickness of the leadframe in the touch down regions, where downholder sections 154 are provided.

Figure 17A:
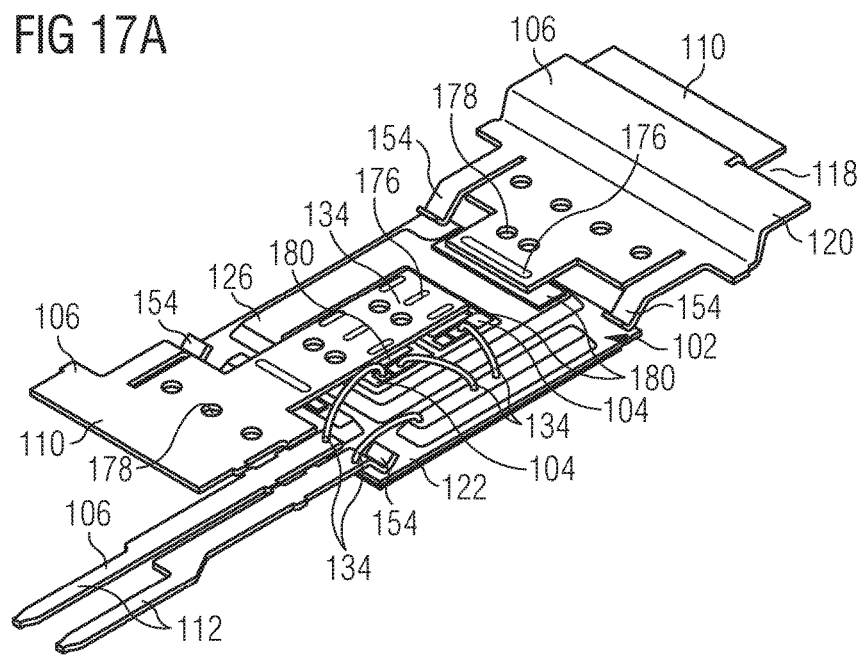
FIG. 17A shows a preform of a package according to another exemplary embodiment with clip design prior to encapsulating.

An additional possibility for further increasing power density of a package 100 according to an exemplary embodiment includes replacing ribbon bonded interconnects constituting electrically conductive elements 134 with a copper clip (compare reference numeral 176 in FIG. 17A). The provision of such a clip 176 may further reduce the electric field between the clip 176 and the die edges/termination structure. In particular, it may be possible to provide an emitter copper clip design with welded, sintered or soldered collector leads.

FIG. 17A shows a preform of a package 100 according to another exemplary embodiment prior to encapsulating.

According to FIG. 17A, the electrically conductive contact structure 106, again configured as a leadframe, comprises clips 176 as connection elements 134 for establishing an electrically conductive connection between the electrically conductive contact structure 106 on the one hand and the upper main surfaces of the electronic chips 104 and the electrically conductive layer 126 of the chip carrier 102 on the other hand. In view of the provision of the clips 176 (in the shown embodiment forming an integral part of the leadframe), the ribbons used in FIG. 7 as electrically conductive connection elements 134 become dispensable. Furthermore, some of the electrically conductive connection elements 134 are embodied as bond wires according to FIG. 17A. Some optional holes 178 are formed in the clips 176. The electrically conductive connection between the clips 176 on the one hand and the electronic chips 104 and the electrically conductive layer 126 on the other hand can be established by a respective solder structure 180, i.e. by soldering. However, the interconnection may also be made by welding.

Figure 17B:
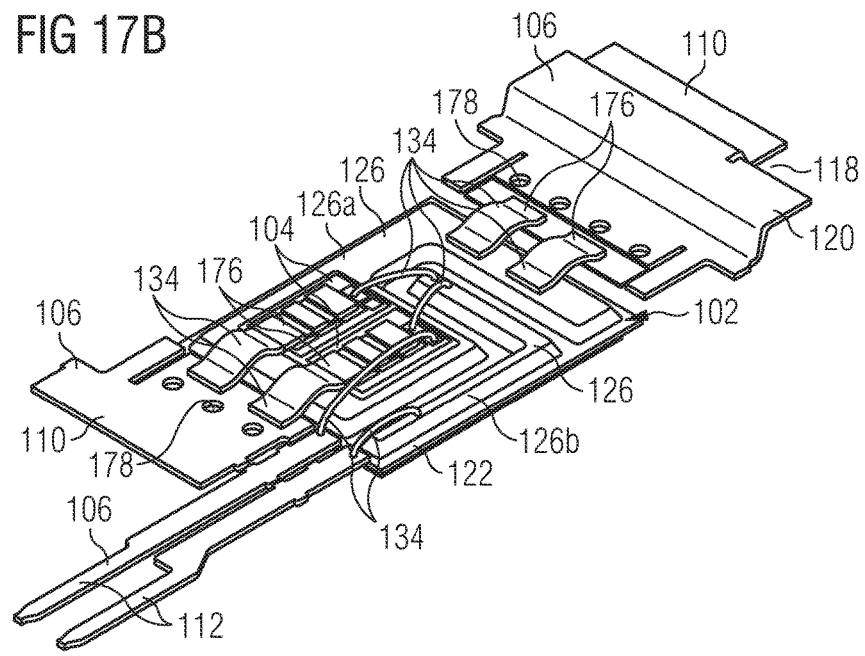
FIG. 17B shows a preform of a package according to still another exemplary embodiment with clip design prior to encapsulating.

FIG. 17B shows a preform of a package 100 according to still another exemplary embodiment with clip design prior to encapsulating. The embodiment of FIG. 17B differs from the embodiment according to FIG. 17A in that, according to FIG. 17B, clips 176 are provided separately from (i.e. not integrally formed with) leadframe-type electrically conductive contact structure 106. According to FIG. 17B, the clips 176 are provided for electrically coupling the electronic chips 104 with the electrically conductive contact structure 106, and for electrically coupling electrically conductive layer 126 of chip carrier 102 with electrically conductive contact structure 106. According to FIG. 17B, electrically conductive layer 126 is composed of two island-like separate layer portions 126a, 126b.

Figure 18:
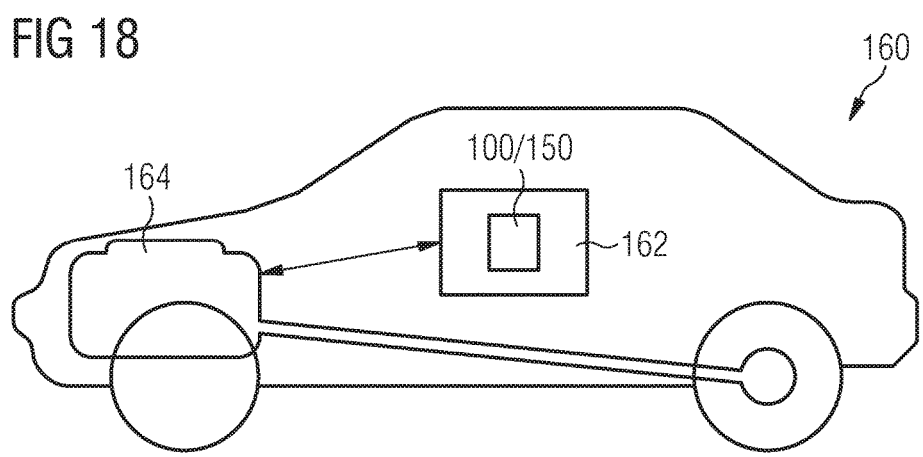
FIG. 18 illustrates schematically a vehicle comprising a power package according to an exemplary embodiment.

FIG. 18 illustrates schematically a vehicle 160 comprising a power package 100 or an electronic device 150 comprising one or more such packages 100, respectively, according to an exemplary embodiment. More specifically, the power package 100 for the electronic device 150 may form part of a power train 162 which may be functionally coupled with electric motor/battery block 164. Hence, a package 100 or power module according to an exemplary embodiment may be used for an automotive application. More specifically, such a package 100 (or an electronic device 150 composed of multiple such packages 100) may be used in the power train 162 of the vehicle 160 (such as an electric vehicle). The packages 100 or the electronic device 150 may function as an inverter in the power train 162.

Furthermore, the invention comprises the following aspects:

Aspect 1. A package, comprising:
 a chip carrier;
 at least one electronic chip mounted on the chip carrier;
 an electrically conductive contact structure electrically coupled with the at least one electronic chip;
 a mold-type encapsulant encapsulating part of the electrically conductive contact structure, and at least part of the chip carrier and of the at least one electronic chip;
 wherein the chip carrier comprises a thermally conductive and electrically insulating core covered on both opposing main surfaces thereof at least partially by a respective brazed electrically conductive layer.

Aspect 2. The package according to Aspect 1, wherein at least one of the electrically conductive layers has a larger thickness than a thickness of the thermally conductive and electrically insulating core.

Aspect 3. The package according to Aspect 1, wherein at least one of the electrically conductive layers has a thickness of more than 0.4 mm, in particular more than 0.5 mm, more particularly more than 0.6 mm.

Aspect 4. The package according to Aspect 1, wherein at least one of the electrically conductive layers is a metal layer, in particular a copper layer or an alloy comprising copper.

Aspect 5. The package according to Aspect 1, wherein the thermally conductive and electrically insulating core is a ceramic core, in particular comprises or consists of one of the group consisting of silicon nitride, aluminium nitride, and aluminium oxide.

Aspect 6. The package according to Aspect 1, comprising a brazing structure, in particular comprising or consisting of silver, between the thermally conductive and electrically insulating core and the electrically conductive layers.

Aspect 7. The package according to Aspect 1, wherein the chip carrier is an Active Metal Brazed (AMB) substrate.

Aspect 8. The package according to Aspect 1, wherein at least part of a surface of the chip carrier being in contact with the encapsulant has an adhesion promoting surface promoting adhesion between the chip carrier and the encapsulant.

Aspect 9. The package according to Aspect 8, wherein the adhesion promoting surface comprises at least one of the group consisting of a roughened surface, and an adhesion promoting coating, in particular an inorganic coating and/or an organic coating.

Aspect 10. The package according to Aspect 1, wherein one of the electrically conductive layers facing the at least one electronic chip is covered by a sinter layer, in particular a patterned sinter layer.

Aspect 11. The package according to Aspect 1, wherein one of the electrically conductive layers facing away from the at least one electronic chip is covered by a sinterable or sintered layer.

Aspect 12. The package according to Aspect 1, wherein one of the electrically conductive layers facing away from the at least one electronic chip is attached to a heatsink.

Aspect 13. The package according to Aspect 1, wherein the thermally conductive and electrically insulating core is configured for electrically insulating the at least one electronic chip with regard to an electronic environment of the package.

Aspect 14. The package according to Aspect 1, wherein the chip carrier forms part of an exterior surface of the package.

Aspect 15. The package according to Aspect 1, wherein at least two plate sections of the electrically conductive contact structure extend beyond the encapsulant and form power terminals for the electronic chip, and at least one lead section of the electrically conductive contact structure extends beyond the encapsulant and forms at least one signal terminal for the electronic chip.

Aspect 16. The package according to Aspect 15, wherein the at least two plate sections extend at different, in particular opposing, side faces beyond the encapsulant.

Aspect 17. The package according to Aspect 16, wherein the at least one lead section extends at the same side face beyond the encapsulant as one of the at least two plate sections.

Aspect 18. The package according to Aspect 17, wherein the at least one lead section and the one of the at least two plate sections extending at the same side face beyond the encapsulant are configured so that the at least one lead section is located in a recess of the other one of the at least two plate sections of an identical other package when the said plate sections of the packages are electrically connected.

Aspect 19. The package according to Aspect 15, wherein at least one of the at least two plate sections extends along at least 50%, in particular along at least 80% of a length of a side face of the encapsulant.

Aspect 20. The package according to Aspect 15, wherein at least one of the at least two plate sections comprises a locally raised bend portion, in particular having a wave profile.

Aspect 21. The package according to Aspect 15, wherein at least a portion of the at least one lead section extends substantially perpendicular to the at least two plate sections.

Aspect 22. The package according to Aspect 15, wherein at least one of the at least two plate sections is configured to be connected to a bus bar arrangement so that a magnetic flux associated with a current flowing into the package is coupled with magnetic flux of the current passing through the bus bar arrangement in opposite direction for an at least partial flux cancelation.

Aspect 23. The package according to Aspect 1, wherein the at least one electronic chip comprises at least one semiconductor power chip, in particular at least one insulated gate bipolar transistor chip.

Aspect 24. The package according to Aspect 1, wherein the electrically conductive contact structure comprises a leadframe.

Aspect 25. The package according to Aspect 1, wherein the electrically conductive contact structure comprises at least one downholder section configured for pressing the chip carrier downwardly towards a mold tool during molding.

Aspect 26. The package according to Aspect 1, comprising electrically conductive elements, in particular at least one of at least one bond wire, at least one bond ribbon, and at least one clip, electrically connecting the at least one electronic chip with the electrically conductive contact structure and/or the chip carrier with the electrically conductive contact structure.

Aspect 27. The package according to Aspect 1, wherein the encapsulant comprises a resin-based mold compound, in particular an epoxy resin-based mold compound.

Aspect 28. A package, comprising:
a chip carrier which comprises a thermally conductive and electrically insulating core covered on both opposing main surfaces thereof at least partially by a respective brazed electrically conductive layer, in particular an Active Metal Brazed (AMB) substrate;
at least one electronic chip mounted, in particular sintered, on the chip carrier;
an electrically conductive contact structure, in particular of a leadframe type, comprising at least one downholder section, in particular at least three downholder sections, configured as touchdown region for pressing the chip carrier towards a mold tool during molding for preventing mold flash.

Aspect 29. An electronic device comprising at least two packages according to Aspect 1, wherein in particular one of the power terminals of one of the packages is electrically coupled with one of the power terminals of the other one of the packages.

Aspect 30. The device according to Aspect 29, configured as at least one of the group consisting of a half-bridge, an H-bridge, an arrangement of three half-bridges, an arrangement of four half-bridges, and an inverter.

It should be noted that the term "comprising" does not exclude other elements or features and the "a" or "a" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, and composition of matter, means, methods and steps described in the specification. Accordingly, the appended claims are intended to include within their scope such processes, machines, manufacture, compositions of matter, means, methods, or steps.

What is claimed is:

1. A method of manufacturing a package, the method comprising:
   forming a chip carrier by covering a thermally conductive and electrically insulating core on both opposing main surfaces thereof at least partially by a respective electrically conductive layer by brazing the respective electrically conductive layer on a respective one of the main surfaces;
   mounting at least one electronic chip on the chip carrier;
   electrically coupling an electrically conductive contact structure with the at least one electronic chip; and
   encapsulating part of the electrically conductive contact structure, and at least part of the chip carrier and of the at least one electronic chip by a mold-type encapsulant.

2. The method according to claim 1,
   wherein at least one of the electrically conductive layers has a larger thickness than a thickness of the thermally conductive and electrically insulating core.

3. The method according to claim 1,
   forming a brazing structure between the thermally conductive and electrically insulating core and the electrically conductive layers.

4. The method according to claim 2,
   wherein the electrically conductive layers are brazed at a temperature of above than 600° C. to the electrically insulating core with the respective brazing structure in between.

5. The method according to claim 1,
   wherein the brazing structure particular comprises or consists of silver.

6. The method according to claim 1,
   wherein at least part of a surface of the chip carrier being in contact with the encapsulant has an adhesion promoting surface promoting adhesion between the chip carrier and the encapsulant.

7. The method according to claim 6,
   forming the adhesion promoting surface by roughening the surface of the chip carrier being in contact with the encapsulant, in particular by at least one of a plasma treatment, laser treatment and chemical treatment.

8. The method according to claim 6,
forming the adhesion promoting surface by an adhesion promoting coating, in particular an inorganic coating and/or an organic coating.

9. The method according to claim 1,
covering at least one of the electrically conductive layers facing the at least one electronic chip by a sinter layer, in particular a patterned sinter layer.

10. The method according to claim 9,
wherein the sinter layer is a sinter paste, in particular comprising silver.

11. The method according to claim 9,
wherein the sinter layer has a thickness of less than 50 μm, in particular less than 30 μm.

12. The method according to claim 9,
wherein the covering of the at least one of the electrically conductive layers is done by at least one of stencil printing and screen printing.

13. The method according to claim 1,
attaching one of the electrically conductive layers facing away from the at least one electronic chip to a heatsink.

14. The method according to claim 1,
electrically insulating the at least one electronic chip with regard to an electronic environment of the package by the thermally conductive and electrically insulating core.

15. The method according to claim 1,
forming the chip carrier such that the chip carrier forms a part of an exterior surface of the package.

16. The method according to claim 1,
forming at least two plate sections of the electrically conductive contact structure in such a way that the at least two plate sections extend beyond the encapsulant and form power terminals for the electronic chip, and at least one lead section of the electrically conductive contact structure extends beyond the encapsulant and forms at least one signal terminal for the electronic chip.

17. The method according to claim 1,
forming at least one downholder section being part of the electrically conductive contact structure for pressing the chip carrier downwardly towards a mold tool during molding.

18. The method according to claim 17,
wherein the at least one downholder section is configured for applying pressure onto one of the four corners of the chip carrier.

19. The method according to claim 1,
electrically connecting the at least one electronic chip with the electrically conductive contact structure and/or the chip carrier with the electrically conductive contact structure by an electrically conductive elements, in particular at least one of at least one bond wire, at least one bond ribbon, and at least one clip.

20. The method according to claim 1,
installing the manufactured package in an automotive application, in particular in a power train of a vehicle, more particularly as an inverter in a power train of a vehicle.

* * * * *